United States Patent
Bao et al.

(10) Patent No.: US 10,355,558 B2
(45) Date of Patent: Jul. 16, 2019

(54) PROCESSOR CONTROLLED ENERGY HARVESTER SYSTEM

(71) Applicant: Rising Star Pathway, a California Corporation, Cupertino, CA (US)

(72) Inventors: Rong Bao, Shanghai (CN); YiWei An, Beijing (CN); YiWen Pu, Shanghai (CN); Zeru Li, Saratoga, CA (US); Ryane Li, San Martin, CA (US); Serena Mao, Fremont, CA (US)

(73) Assignee: RISING STAR PATHWAY, A CALIFORNIA CORPORATION, Cupertino, CA (US)

( * ) Notice: Subject to any disclaimer, the term of this patent is extended or adjusted under 35 U.S.C. 154(b) by 0 days.

(21) Appl. No.: 16/236,600

(22) Filed: Dec. 30, 2018

(65) Prior Publication Data

US 2019/0140517 A1 May 9, 2019

Related U.S. Application Data

(63) Continuation-in-part of application No. 16/153,779, filed on Oct. 7, 2018.

(51) Int. Cl.
*H02K 7/18* (2006.01)
*H02K 7/116* (2006.01)
(Continued)

(52) U.S. Cl.
CPC ............ *H02K 7/1853* (2013.01); *F03D 9/12* (2016.05); *F03D 9/25* (2016.05); *F03G 3/06* (2013.01); *F24S 20/00* (2018.05); *H01L 35/30* (2013.01); *H02K 7/108* (2013.01); *H02K 7/116* (2013.01); *H02S 10/10* (2014.12); *H02S 40/22* (2014.12); *H02S 40/38* (2014.12); *H02S 40/44* (2014.12); *F05B 2260/421* (2013.01)

(58) Field of Classification Search
USPC .................................. 290/1 C, 1 R; 368/148
See application file for complete search history.

(56) References Cited

U.S. PATENT DOCUMENTS 1,332,023 A 12/1885 Von Der Heydt
2,667,737 A 2/1954 Gazda
(Continued)

*Primary Examiner* — Pedro J Cuevas
(74) *Attorney, Agent, or Firm* — Stephen E. Zweig

(57) ABSTRACT

Computer-processor controlled energy harvester system. The system uses a plurality of oscillating weight type energy collectors, each configured to store the energy from changes in the system's ambient motion as stored mechanical energy, often in a compressed spring. The energy collectors are configured to move between a first position where the energy collector stores energy, to a second position where the energy collectors release stored energy to a geared electrical generator shaft, thus producing electrical energy, often stored in a battery. A plurality of processor controlled electronic actuators, usually one per energy collector, control when each energy collector stores and releases energy. The processor can use accelerometer sensors, battery charge sensors, and suitable software and firmware to optimize system function. The system can use the energy for various useful purposes, including sensor monitoring, data acquisition, wireless communications, and the like, and can also receive supplemental power from other sources.

17 Claims, 13 Drawing Sheets

(51) Int. Cl.
*H02K 7/108* (2006.01)
*F03D 9/12* (2016.01)
*F03D 9/25* (2016.01)
*H02S 10/10* (2014.01)
*H02S 40/22* (2014.01)
*H02S 40/38* (2014.01)
*H01L 35/30* (2006.01)
*F03G 3/06* (2006.01)
*F24S 20/00* (2018.01)
*H02S 40/44* (2014.01)

(56) References Cited

U.S. PATENT DOCUMENTS

| | | | |
|---|---|---|---|
| 2,874,532 A | 2/1959 | Baier | |
| 3,002,713 A * | 10/1961 | Noxon | G05D 1/0061 244/181 |
| 7,652,386 B2 * | 1/2010 | Donelan | F03G 5/00 290/1 R |
| 7,659,636 B2 * | 2/2010 | Donelan | F03G 5/00 290/1 C |
| 8,299,634 B2 * | 10/2012 | Donelan | F03G 5/00 290/1 C |
| 8,487,456 B2 * | 7/2013 | Donelan | F03G 5/00 290/1 C |
| 9,057,361 B2 * | 6/2015 | Donelan | F03G 5/00 |
| 9,204,796 B2 * | 12/2015 | Tran | G06F 19/3418 |
| 9,525,323 B1 | 12/2016 | Lee | |
| 9,639,685 B2 * | 5/2017 | Anderson | G06F 21/32 |
| 9,703,268 B2 * | 7/2017 | Perez-Feliciano | G04G 9/0064 |
| 2008/0277943 A1 * | 11/2008 | Donelan | F03G 5/00 290/1 R |
| 2008/0278028 A1 * | 11/2008 | Donelan | F03G 5/00 310/300 |
| 2010/0276944 A1 * | 11/2010 | Donelan | F03G 5/00 290/1 R |
| 2013/0038056 A1 * | 2/2013 | Donelan | F03G 5/00 290/7 |
| 2014/0077946 A1 * | 3/2014 | Tran | G06F 19/3418 340/539.13 |
| 2014/0152008 A1 * | 6/2014 | Donelan | F03G 5/00 290/7 |
| 2014/0335490 A1 * | 11/2014 | Baarman | A61B 5/002 434/236 |
| 2015/0041663 A1 * | 2/2015 | Oliver | G01J 1/0219 250/372 |
| 2015/0359467 A1 * | 12/2015 | Tran | A61B 5/0022 600/301 |
| 2017/0075314 A1 * | 3/2017 | Perez-Feliciano | G04G 9/0064 |
| 2019/0038133 A1 * | 2/2019 | Tran | G06F 19/3418 |
| 2019/0041798 A1 * | 2/2019 | Zhang | G04B 5/08 |

* cited by examiner

PROCESSOR CONTROLLED ENERGY HARVESTER SYSTEM

CROSS REFERENCE TO RELATED APPLICATIONS

This application is a continuation in part of U.S. patent application Ser. No. 16/153,779, filed Oct. 7, 2018, the entire contents of which are incorporated herein by reference.

BACKGROUND OF THE INVENTION

Field of the Invention

This invention is in the field of energy harvester systems.

Description of the Related Art

Energy harvester systems have been employed for various purposes since at least the 1700s. One of the earliest examples of energy harvesters were the mechanisms employed to produce self-winding mechanical watches. These watches, such as the watches produced by Abraham-Louis Perrelet in 1775-1777, generally employed an oscillating weight type energy collector that uses the natural motion of the user's body to wind a watch mainspring. These self-winding mechanisms became popular about a hundred years ago, shortly after World War I.

Examples of such oscillating weight type energy collectors include Von Der Heydt, U.S. Pat. No. 332,023; Antoine U.S. Pat. No. 2,667,737, and Baier, U.S. Pat. No. 2,874,532. These oscillating weight or oscillating pendulum type energy collectors often operate by using the ambient vibration of the device to cause an oscillating pendulum to wind a spring, usually a coiled spring. The energy in the spring can then be used to perform useful work, such as operating the mechanism of a watch.

More recently, Lee et. al., in U.S. Pat. No. 9,525,323, the entire contents of which are incorporated herein by reference, described a mechanical energy harvester system comprising a plurality of such oscillating weight mechanical energy collectors. Lee used a mechanical timing type cam gear mechanism, itself powered by an oscillating weight type energy collector, to control when the energy from each of his plurality of oscillating mechanical energy collectors was released.

FIG. 1 shows the prior art of Lee, in which a mechanical rotating cam is used to control when each of a plurality of oscillating weight type energy collector discharges its stored energy.

Lee's energy harvester system is shown as (100). His support base member is (101) with a surface (101a). His "primary energy collector" (102), which can be considered to be part of his mechanical cam control system, is itself an oscillating pendulum type mechanical energy harvester used to mechanically move his cam control system. His primary energy collector's primary base is (103), with a primary central axial member (104). There is also a primary pendulum member (105), primary geared case (106), primary gear tooth elements (107), and a primary case cover (108).

Lee's mechanical cam control system includes a cam gear ring (109), comprising cam gear ring tooth elements (110) and a cam gear element (111a) that is essentially the cam itself. The cam gear ring has various pins such as (112a, 112b, 112d, and 112c) to be discussed shortly. Mounted inside the cam gear ring are various "secondary energy collectors" (113, 114, 115, 116) which actually serve as the main energy storage reservoir for Lee's system. The space inside the cam gear ring is (117). The secondary energy collectors include secondary bases (118), secondary axial members (119), secondary geared cases (121), secondary gear tooth elements (122), and secondary spring elements (123). The secondary energy collectors release their stored energy a cam (111a) activated coupling to a central gear (124) with central gear tooth elements (125) that can, for example, be coupled to a generator.

FIG. 2 shows an additional detail from the prior art of Lee, showing the various tracks (guide elements) by which Lee's various oscillating weight type energy collectors (113, 114, 115, 116) travel when engaging and disengaging, under mechanical cam control, from Lee's central gear (124). Here there are multiple guide elements (or "tracks") (126a, 126b, 126c, 126d). Each secondary energy collector is slideably attached, on its base side to one of these tracks, allowing the various secondary energy collectors to slide back and forth on the track under cam (111a) control. When the cam 111a, knocks that particular secondary energy collector off of its particular pin (112a, 112b, 112c, or 112d), and pushes that particular secondary energy collector in towards the central gear (124), the energy collector engages with the central gear and releases any stored energy into the central gear (124) by mechanically coupling with the various gear elements (125). Once the rotating cam gear ring (109, inner surface 109a) is rotated further by the action of the primary energy collector, "restoring springs" (128a, 128b, 128c, 128d mounted inside the tracks) force that particular secondary energy collector away from the central gear, and the secondary energy collector returns back to its original position and hooks again onto its respective pin. Other elements in this figure include guide element slots (127a, 127b, 127c, 127d), FIG. 3 shows an additional detail from the prior art of Lee, showing a detail of how Lee's rotating mechanical cam can disengage one of Lee's oscillating weight energy collectors from a pin, causing that particular oscillating weight energy collector to engage with Lee's rotating cylinder. As can be seen, as the primary energy collector (102) that mechanically rotates the cam ring (109) through gear tooth elements (107, 110) operates, the cam element (111a) moves down, and displaces that particular secondary energy collector's (here 113) clamping member or hook (134) away from its respective pin (112a). The curved surface of the cam element (111a) then forces that particular secondary energy collector to move, against the force of the restoring spring, towards the central gear (124).

BRIEF SUMMARY OF THE INVENTION

The invention was inspired, in part, by the insight that oscillating weight type energy collectors could, in association with modern computer processor control mechanisms, be used to create more powerful, flexible, and more useful energy harvesters. Such improved energy harvesters could be developed to harness and capture mechanical energy stored in a large number of such energy collectors, and translate this stored mechanical energy to electrical power in an optimal manner. In particular, computer control can allow the stored mechanical energy to be released according to a more intelligent schedule, such as when the system actually needs this energy, as opposed to the less flexible, and often semi-random, prior art methods.

In some embodiments, the present invention may be an energy harvester system comprising at least one computer processor, usually a battery, at least one electrical generator that is operated by a shaft comprising at least one moveable generator gear, and at least one support base where various components can be mounted. Typically, at least one, and typically a plurality of oscillating weight type energy collectors are movably connected to this support base. Usually, each of the various energy collectors is configured to move back and forth between a first position and a second position. In the first position, the processor is configured to store ambient motion energy (more strictly, this "ambient motion energy" is energy caused by changes in ambient acceleration, which can also include vibration energy) along at least one direction as stored mechanical energy. In the second position, the various energy collectors are configured to release any stored mechanical energy to at least one moveable generator gear, which in turn can operate one or more electrical generators.

In order to control the function of the various energy collectors, for each energy harvester, typically at least one electronic actuator, along with an associated (usually attached) actuator cam, is attached to an energy harvester support base. These electronic actuators are typically configured so that each actuator can provide an actuator force in response to control signals from the system's computer processor. This actuator force moves the actuator cam, and the actuator cam, in turn, provides a cam force against the corresponding energy harvester associated with that particular electronic actuator and actuator cam.

Typically, each of the various energy collectors is configured so that, upon receiving this cam force, the energy collector moves from the first position (where the energy collector has been storing ambient motion energy, to a second position where the energy collector becomes coupled to a moveable generator gear. In this second position, the energy harvester releases its stored mechanical energy to the generator gear. This energy release typically causes the moveable generator gear (which can be a generator gear shaft) to rotate. The net result is that the energy from that particular processor engaged energy collector is converted, by way of rotation of the generator gear and the electrical generator, into electrical energy. This electrical energy can be used for various purposes, including charging a battery, providing electrical power to various useful devices (loads), operating various sensors, and the like.

DETAILED DESCRIPTION OF THE INVENTION

Figure 1:
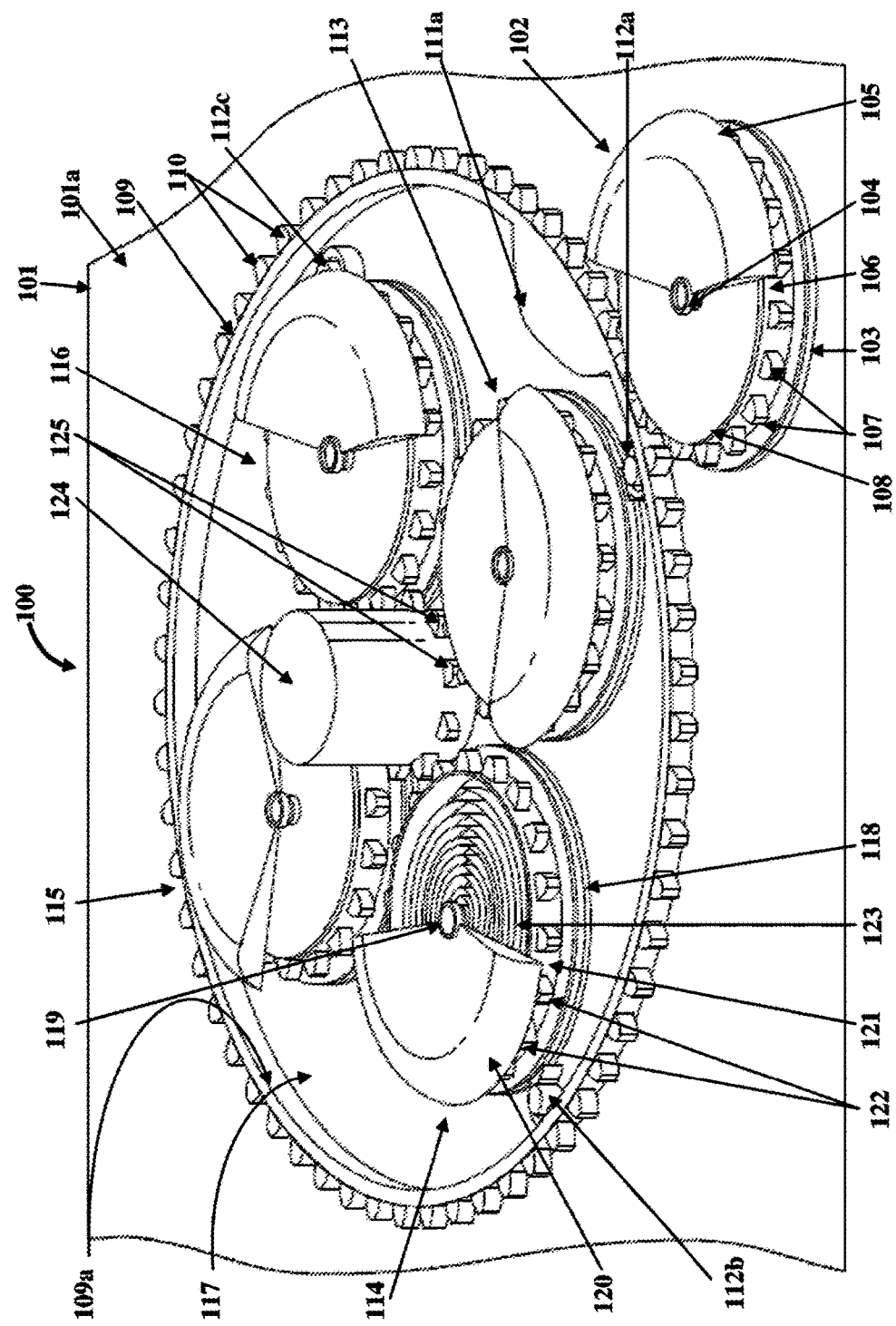
FIG. 1 shows the prior art of Lee, in which a mechanical rotating cam is used to control when each of a plurality of oscillating weight type energy collector discharges its stored energy.
Figure 2:
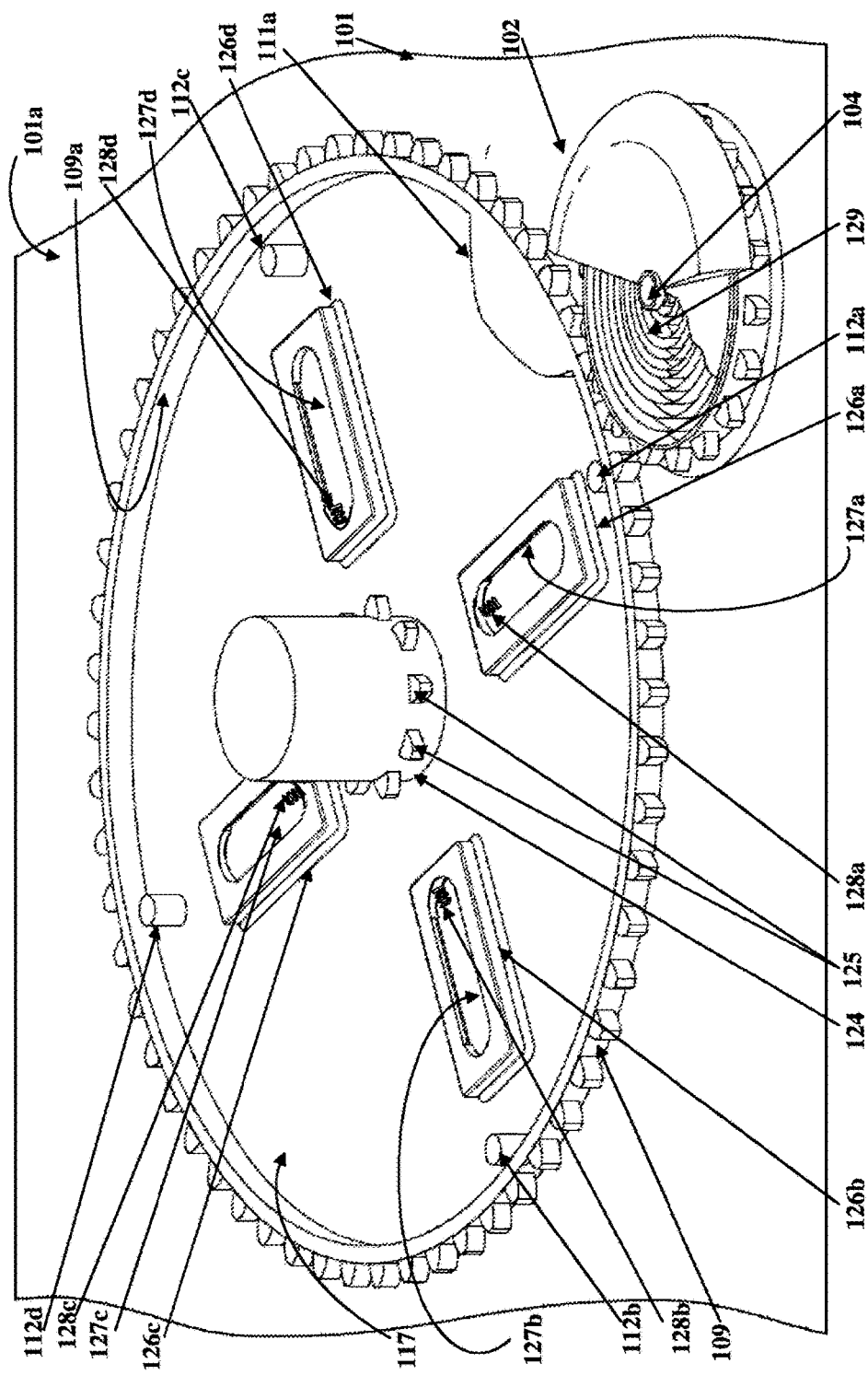
FIG. 2 shows an additional detail from the prior art of Lee.

In some embodiments, the invention may be a processor-controlled energy harvester system. This system may comprise at least one computer processor (300), and at least one electrical generator (302) comprising at least one moveable generator gear (200). The system will also comprise at least one support base (e.g. 101) that often can be one or more sheets of a solid rigid material, such as metal or plastic, where at least some of the various components can be mounted.

The system will further comprise at least one energy collector (e.g. 113a . . . 113f) that is movably connected to (e.g. movably mounted on) its respective support base (101). Each at least one energy collector will typically be configured to, in a first position on its support base, store ambient motion energy (as previously discussed, this "ambient motion" energy is actually energy caused by changes in ambient motion, such as the energy from acceleration and changes in acceleration, but for simplicity will be referred to here as "ambient motion" type energy) along at least one direction (e.g. horizontal, vertical) of ambient motion (e.g. the system can use sideways or horizontal ambient motion to move a pendulum, and compress a spring) as stored mechanical energy. Each at least one energy collector will typically also be configured to, in a second position on its support base, release this stored mechanical energy to at least one moveable generator gear.

The system will further comprise at least one electronic actuator (e.g. 202a, 202e, 202f) and an associated (and often attached) actuator cam (e.g. 210a, 210e). This at least one electronic actuator is typically attached to its respective support base (101) as well. Often the electronic actuator is attached so that the attached actuator cam can pivot across a surface of the support base so that the actuator cam (e.g. 210a, 210e) can move towards and away from its respective energy collector in response to signals from the processor (300).

Put alternatively, this at least one electronic actuator (202a, 202e, 202f) can be configured to provide actuator force in response to control signals from the computer processor (300), thus moving the actuator cam (210a, 210e, 210f) and providing actuator cam force. The at least one energy collector can be configured so that upon receiving this actuator cam force, this at least one energy collector moves from a first position (on the support base 101) to a second position (on the support base 101) that is coupled to this at least one moveable generator gear (200), thus releasing stored mechanical energy to the moveable generator gear, and rotating this moveable generator gear. Here, the at least one electrical generator (302) can be configured to convert rotation of this at least one moveable generator gear (200) into electrical energy.

Figure 4:
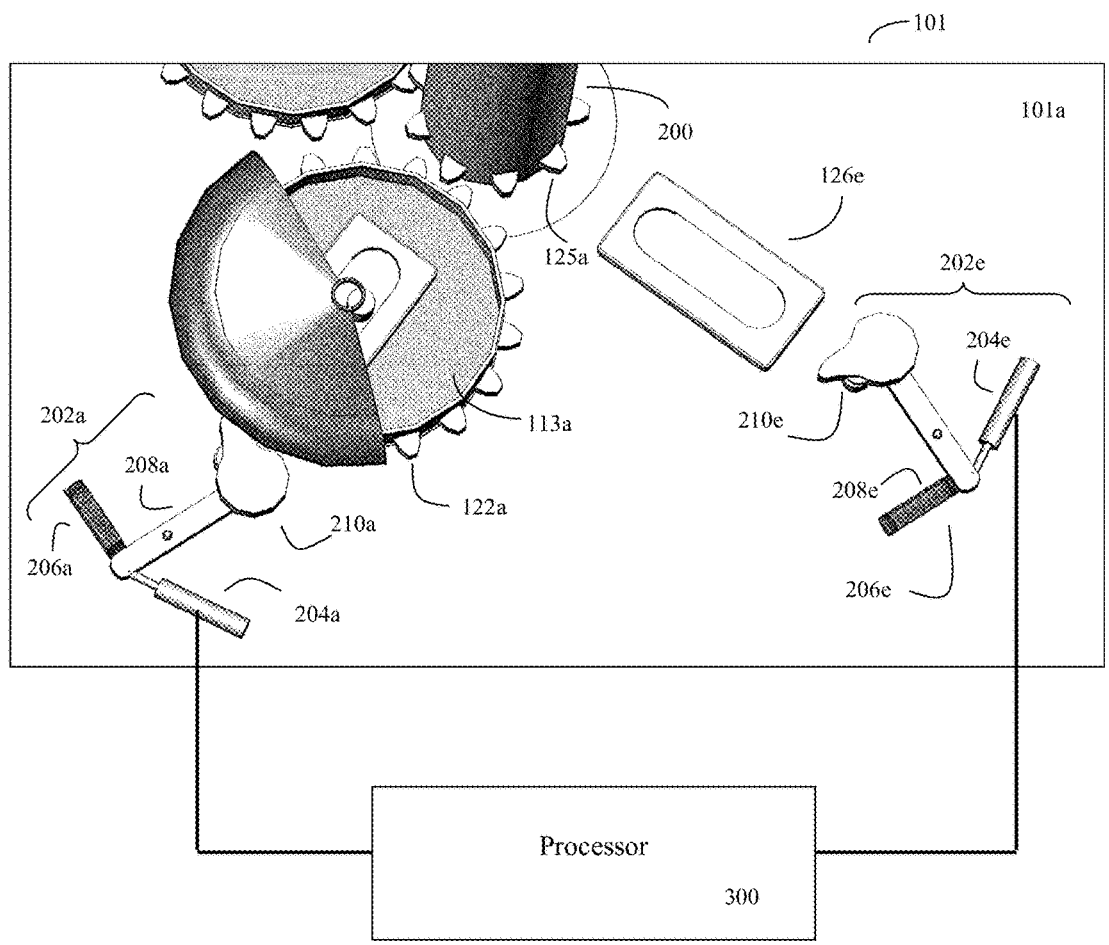
FIG. 4 shows a detail from the present invention, showing an improved energy harvester system that uses computer processor-controlled actuators to control when a given oscillating weight type energy collector discharges its stored energy into a generator gear.

FIG. 4 shows a detail from the present invention, showing an improved energy harvester system that uses computer processor-controlled actuators to control when a given oscillating weight energy collector (113a) discharges its stored energy into a generator gear.

Here, for simplicity, and to better distinguish the teaching of the present invention from prior art, we will occasionally exemplify the invention using a number of components, and occasionally a similar numbering scheme, as previously used by Lee. Thus here, we will designate the present invention's oscillating weight type energy collectors as (113a), and in some embodiments, these energy collectors can have design and components that are similar to Lee's secondary energy collectors. However, these examples are not intended to be limiting. In general, any oscillating weight type energy collector, including other prior-art type mechanical-watch-type oscillating weight energy collector designs, or novel oscillating energy collector designs, may also be used for the present invention. It is sufficient, for the present invention, that the oscillating weight type collector merely collect ambient motion energy as stored energy in a first state, and then be able to release this stored energy in a second state to a generator gear in response to mechanical motion from an electronically activated cam.

For these specific examples, the teaching of Lee, U.S. Pat. No. 9,525,323 is incorporated herein by reference. That is in some embodiments, the present invention can employ coiled springs (spring elements) inside the secondary energy collectors similar to Lee (Lee 123), pendulum elements similar to Lee (Lee 120), tooth elements similar to Lee (Lee 122), cases (Lee 121) similar to Lee, and the like. Alternatively, mechanical energy can be stored by other techniques, such as by stretching or compressing other types of elastic materials configured in other types of shapes.

Thus, in some embodiments, the energy collectors (113a ... 113f) may further comprise an energy collector base (which may be similar to Lee 118, or which may be different) attached to a surface of the support base (101), with a central axial member (104) attached to this energy collector base (118). The energy collector may also comprise a pendulum member (120) rotatably connected to this central axial member (119). This pendulum member (120) can be actuated (e.g. moved) by at least one direction of ambient motion energy, and for example, rotated in one of a clockwise direction and a counterclockwise direction relative to the surface of the support base (101).

Note that if the support base is mounted horizontally, the pendulum may move right and left, and be responsive to sideways ambient motion. If the support base is mounted vertically, the pendulum may move up and down, and be responsive to up and down ambient motion. See FIG. 6 for further discussion.

Although not required by all embodiments of the invention, in some embodiments, the energy collectors (113a ... 113f) may further comprise a geared case (121) encircling this central axial member (119). This geared case may be rigidly attached to the pendulum member (120) and may further run along a base groove (Lee 130, incorporated herein by reference) configured in the energy collector base. In some embodiments, the energy collector's geared case (121) may further comprise a plurality of gear tooth elements (122) positioned on the outer surface of the geared case. The geared case can be further configured to rotate, such as to rotate along the previously discussed base groove.

In some, but not all, embodiments, the energy collector can further comprise a spring element (123) winding around the central axial member (119) within the geared case (121). This spring element can comprise a first end fixedly attached to the central axial member (119) and a second end fixedly attached to an inner surface of the geared case (121). The energy collector can be further configured so that the spring element (123) is compressed by rotation of the pendulum member (120), and this spring element then stores any ambient motion energy as a compressed spring element. The energy collector and the compressed spring element can be configured to release any stored ambient motion energy to rotate the geared case, and thus the generator gear, at least upon proper action by the actuator cam.

In some, but not all, embodiments, the energy collectors may also incorporate a slot design similar to Lee (Lee 127a) and guide projections (Lee 132a) to slidably attach to the tracks (or guide elements) such as (126e). Alternatively, other configurations may be used. In principle, as previously discussed, nearly any type of mechanical watch type energy harvester system previously taught by prior art may be modified for use as the present invention's energy collectors.

In some embodiments, the present invention's energy collectors can also be slidably attached, using tracks such as (126e) to a surface (101) of a support base (101) as per Lee.

In FIG. 4, another energy collector, such as another copy of (113a), which would normally fit into the track (126e), has been removed to allow the details of an optional track (126e) for accommodating the removed energy collector.

FIG. 4, which has one energy collector removed, thus allows the electronic actuator (202e) and associated actuator cam (204e), which would normally act on the missing energy collector, to be better seen. These electronic actuators and associated actuator cams will be discussed in more detail shortly. Note that in FIGS. 5-7, to reduce the burden of numbering each different energy collector with different numbers, the invention's energy collectors are generally referred to as (113f). That is, different energy collectors are all labeled as (113f).

Note that unlike the methods of Lee, which require a single central gear, the present invention can use more than one gear (or shaft or geared shaft) to transfer energy to a generator. An additional difference between the present invention and Lee is that according to the present invention, this power transfer gear (or shaft, or geared shaft) used to transfer energy to a generator, need not be central to the apparatus. Thus, the term "central gear" is not appropriate. Here we will introduce the alternate term "generator gear" (or generator geared shaft) and designate this generator gear as (200). In some embodiments, only one generator gear (200) may be used, and this only one generator gear can be put in the center of the apparatus if this is desired. However, in other embodiments, such as FIG. 6, more than one generator gear may be used, and this generator gear may be located wherever desired.

Electronic Actuators and Actuator Cams:

The present invention differs significantly from the prior art with regards to the control systems used to determine when mechanical energy stored in the energy collectors is transferred to the generator(s). As previously discussed, a significant drawback of prior art, such as Lee, was that the release of stored energy in Lee's secondary energy collectors occurred on a strange schedule that was both random (because Lee's mechanical cam gear ring was only activated by ambient motion) and yet at the same time fixed and mechanical. The fixed mechanical aspects were because when random ambient motion moved Lee's cam gear ring, Lee's cam activation was otherwise controlled by Lee's primary energy collectors (102), mechanical cam gear ring (108) and mechanically controlled cam (111a).

With Lee's methods, all of his secondary energy collectors, such as (113, 114, 115, 116) could be nearly full of stored mechanical energy. Yet, even if all of Lee's secondary energy collectors were fully loaded with stored mechanical energy, if there was insufficient ambient motion or vibration to then cause Lee's primary energy collector (102) to advance Lee's mechanical cam gear ring (109) and cam element (111a), then none of this stored mechanical energy could be harvested. There was no way to release this stored mechanical energy, even if a power consuming element in the system required this energy to function.

By contrast, according to the present invention, a more flexible system is provided by using processor controlled electronic actuators that in turn control actuator cams. These electronic actuators are shown in FIG. 4 as (202a, 202e and elsewhere as 202f), and their associated actuator cams are shown in FIG. 4 as (210a) and (210e). In some embodiments, the electronic actuators can comprise an electronically controlled actuator element (204a, 204e, etc.) that may, for example, expand or contract in response to processor controlled electrical current. The electronic actuator may also comprise an actuator spring (206a, 206e) that returns the actuator to a resting position once the processor controlled electrical current stops. The electronic actuator may also comprise a pivoting lever (208a, 208e) attached at a distal end to both the electronically controlled expansion element and the actuator spring. So, when processor controlled electrical current is applied, the pivoting lever can move to an activated position due to contraction or expansion of the electronically controlled actuator element. When processor controlled electrical current is turned off, the pivoting lever can return to a resting position due to the action of the actuator spring.

The other end of the pivoting lever (208a, 208e) can comprise, or at least be attached to, an actuator cam (210a, 210e, etc.). A computer processor, such as (300), usually powered by a battery or other means (see FIG. 7 for more discussion), can control the action of the electrically controlled actuator element (204, 204e, etc.). So, when power is applied by the processor, the cam moves to an activated position, and when this power is turned off by the processor, the cam returns to a resting position.

Note that in some embodiments, each electronic actuator can comprise a moving actuator component configured, upon response to control signals from the computer processor, to at least incrementally move the actuator cam towards a position that generates a cam force. This cam force can, in turn interact with the energy collector to move the energy collector from a first position where the energy collector just stores ambient motion (acceleration) or vibration energy, towards a configuration or second position where the energy collector can release its stored mechanical energy into a generator gear (e.g. can rotate a generator gear shaft 200).

Various devices can be used to implement the electronically controlled actuator element (204a, 204e). These can include electromagnet actuators (e.g. relays, solenoids, and the like), as well as various types of electric motors. Various materials, electroactive expanding and contracting materials, such as electroactive polymers, are also known to expand and contract in response to electrical voltage and/or current, and these electroactive expanding and contracting materials may also be used. Examples of such electroactive expanding and contracting materials include electroactive polymers including rubber, ferroelectric polymers such as polyvinylidene fluoride, ionic polymeric-metal composites, hydrogels, and other types of materials. Ceramic piezoelectric materials may also be used. In general, any material or device that is known to expand, contract, or move upon receiving an electrical stimulus may be used for the invention's electronically controlled actuator elements.

Thus, in some embodiments, each electronic actuator further comprises an electronically controlled actuator element (204a, 204e), such as an electromagnetic actuator element, or an electroactive polymer element or other electroactive expanding or contracting material, configured to expand or contract in response to electrical current signals from the computer processor (300).

Figure 3:
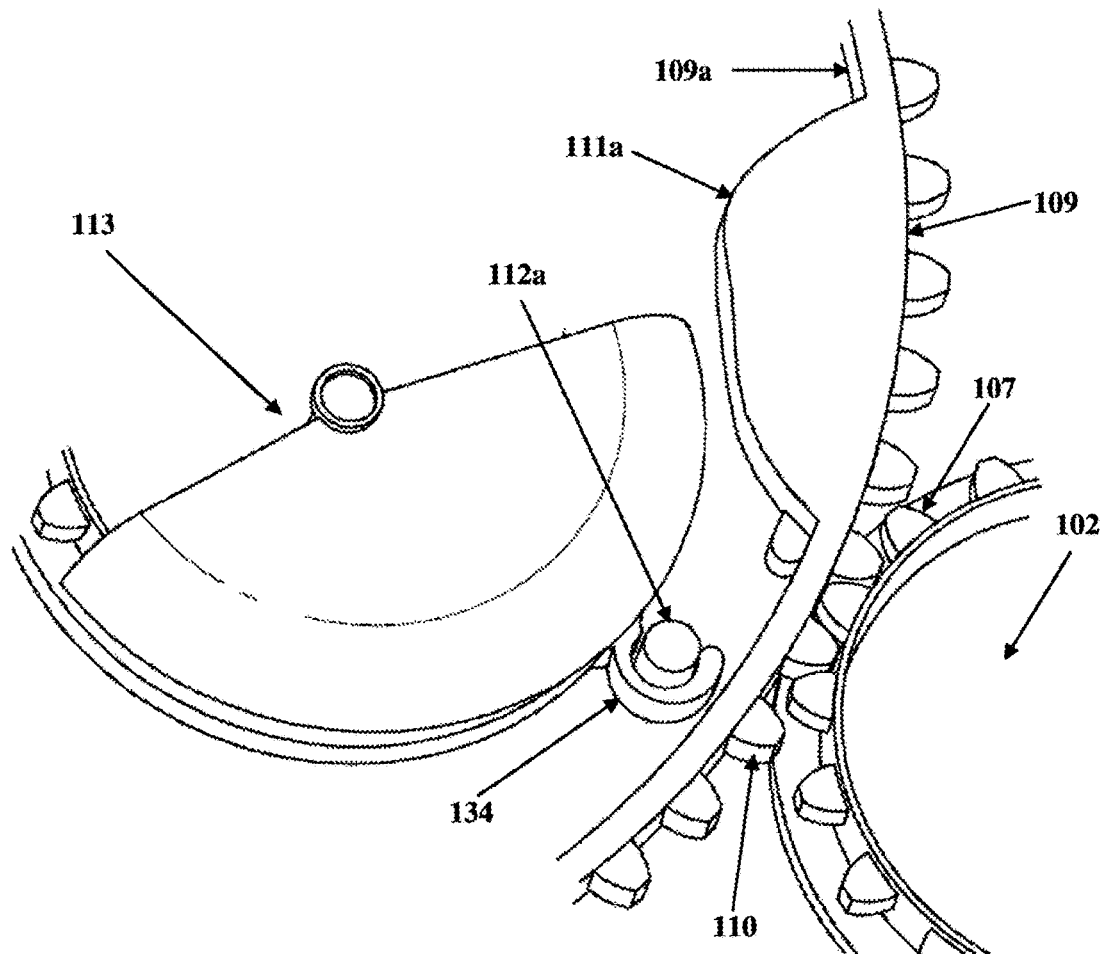
FIG. 3 shows an additional detail from the prior art of Lee, showing a detail of how Lee's rotating mechanical cam can operate to disengage one of Lee's oscillating weight energy collectors from a pin, causing that particular oscillating weight energy collector to engage with Lee's rotating cylinder.

In some embodiments, the invention may further utilize a pin (112a) and clamping member (134) arrangement, similar to that taught by Lee (see FIG. 3) to keep an energy collector in a first, accumulate motion energy, position. The invention's actuator cam head may be configured with a shape similar to Lee (111a), and this cam may be used to dislodge the invention's energy collector from its first normal resting position, and towards generator gear (200) (e.g. towards a second position where the energy collector then releases its stored mechanical energy). Other cam shapes and configurations may also be used.

More specifically, in some embodiments, the invention's energy harvester system can further comprise a plurality of guide elements (such as 126a) positioned on a surface of the support base (101). Each of these guide elements can comprise a slot or configured to slidably engage with a guide projection (such as Lee 132a) on the bottom of the various energy collectors. In some embodiments, the activator cam head, after dislodging the invention's energy collector from its first "clamped" normal resting position, can produce an unclamped energy collector configured to slide towards the moveable generator gear (200) via a corresponding guide element (126e).

In some embodiments, the invention may further employ a restoring spring element (128a) positioned in each of the guide elements (e.g. 126a) for returning an actuator cam unclamped energy collector back from a second position to a first clamped position.

Typically, while in their first "resting" position, the invention's various energy collectors, such as (113a), may be configured to harvest ambient motion and vibrational energy by using the movement of the pendulums (120) or other type oscillating weight to wind their internal springs (such as 123), or otherwise compress or expand an energy storage material such as an elastic material. Upon receiving a signal from the processor (300), the particular electromagnetic actuator (e.g. 202a, 202e) selected by the processor will exert actuator cam force on the energy collector, forcing the energy collector to, for example, move along a track such as (126e) towards a second position where the energy collector can mechanically couple with, and transfer, its stored mechanical energy to a generator gear, such as (200). This can be done by various methods. In some embodiments, gear teeth (such as 122a) on the energy harvester can engage with corresponding gear teeth elements (125a) in the generator gear shaft (200). This transference of mechanical energy will cause the generator gear (200) (generator gear shaft) to rotate, ultimately transferring the stored mechanical energy to a generator (302), and hence to electrical power. In some configurations, however, gear teeth are not needed, and energy coupling may be via friction, lever action, or other method.

Figure 5:
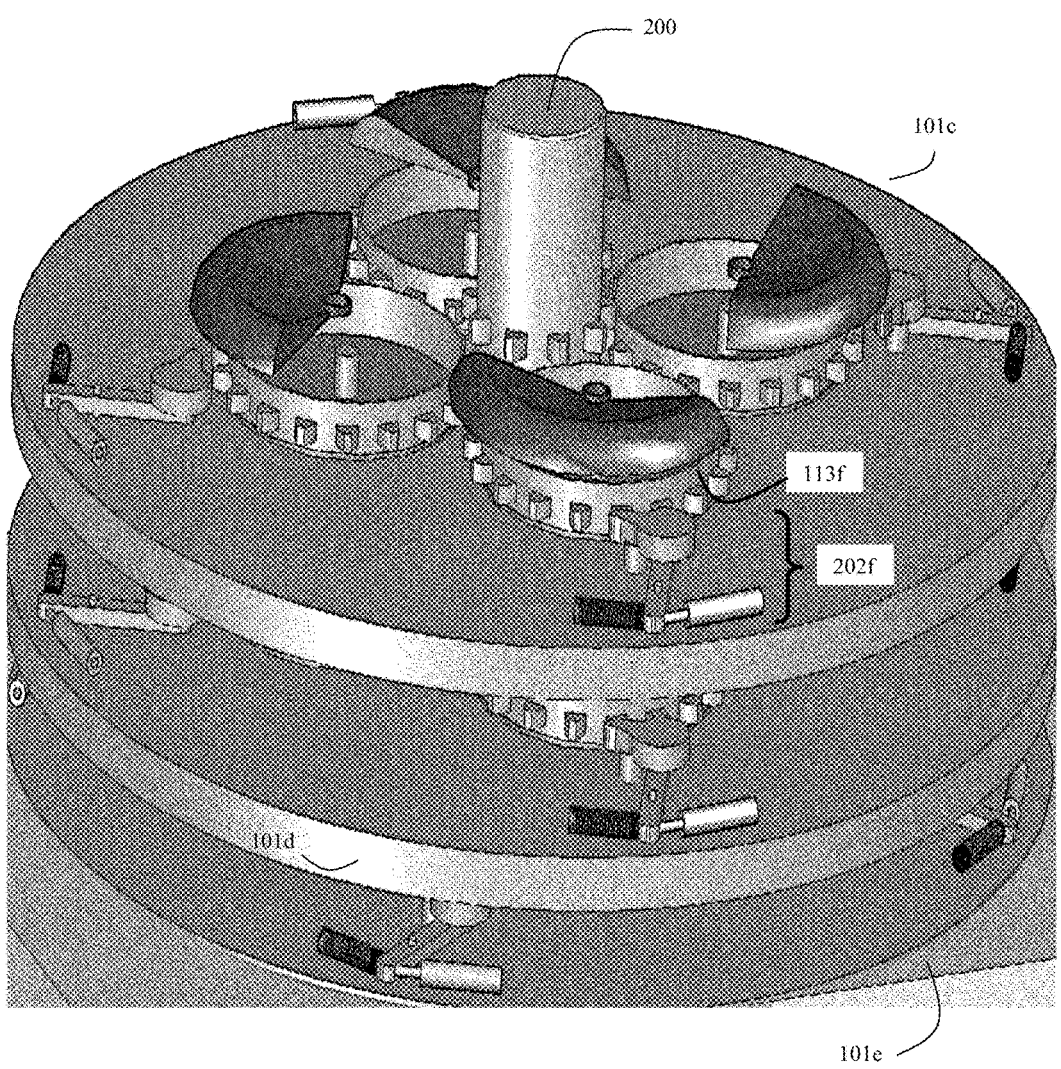
FIG. 5 shows an alternative embodiment of the present invention, here with a plurality of support bases, where each support base, in turn, has a plurality of oscillating weight type energy collectors.

FIG. 5 shows an alternative embodiment of the present invention, in which the various energy collectors are stacked on a plurality of different support layers. In this embodiment, there are a plurality of support bases (101c, 101d, 101e). Each support base, in turn, is configured with a plurality of oscillating weight type energy collectors (such as 113f). These various support bases (101c, 101d, 101e) are stacked in parallel above each other, and in this embodiment are all configured to drive the same generator gear (200). Note that according to the invention, each different energy collector is controlled by its own specific corresponding processor controlled electronic actuator (202f). Here, assume that each individual processor controlled electronic actuator is individually controllable by the processor (300), so that the processor can use a specific electronic actuator to cause a specific energy collector to release energy to the generator gear, according to whatever software or firmware program the processor is executing at a given time.

Put alternatively, in some embodiments, the energy harvester system's support base (101) can comprise a plurality of support bases (see FIG. 5 101c, 101d, 101f). That is, there will be at least first and second support bases. In these embodiments, each of these different support bases will typically further comprise at least one energy collector (e.g. at least one of 113f), as well as at least a portion of a moveable generator gear (for example, one generator gear 200 may be a generator gear shaft that may pass through multiple support bases, and each support base can access at least that support bases' portion of the generator gear shaft).

Figure 6:
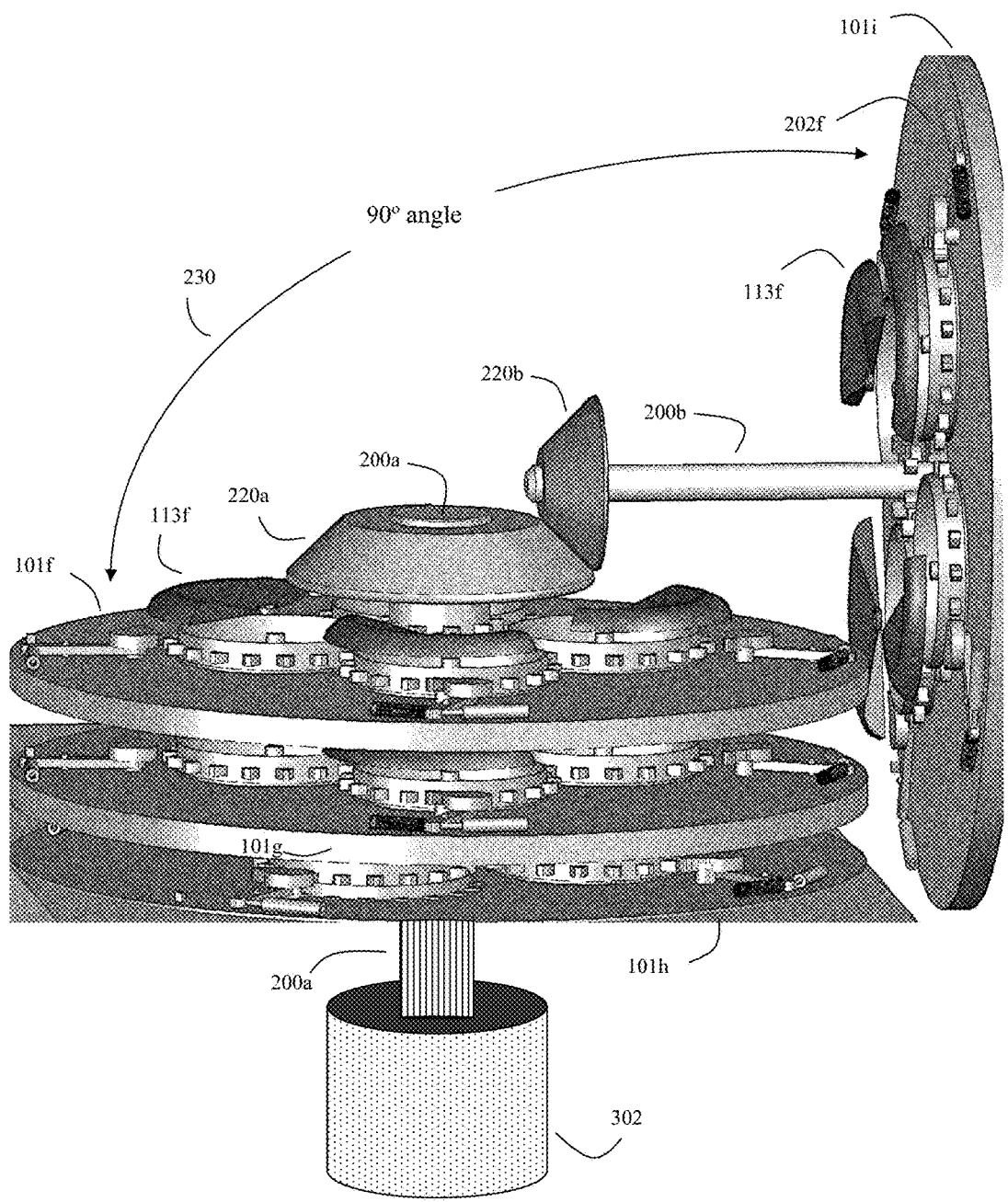
FIG. 6 shows another embodiment of the present invention, in which again each support base has a plurality of oscillating weight type energy collectors. In this embodiment, some support bases are positioned at an angle with respect to other support bases, thus allowing the system to collect energy from multiple different directions of motion or vibration.

These various support bases may be mounted parallel to each other, as shown in FIG. 5, but as shown in FIG. 6, other non-parallel configurations are also possible, and indeed, such other configurations may be desirable.

In FIG. 5, at least some of the support bases are mounted so that the at least one energy collector from a first support base (such as 101c) are parallel to at least one energy collector from a second support base (101d). In FIG. 5, these energy collectors can all collect ambient motion energy (e.g. (changes in acceleration) in a left-right (horizontal) direction, but will generally be ineffective at collecting ambient motion or vibrational energy in an up-down (vertical) direction.

To increase the efficiency of the system in capturing a broader range of directions of ambient motion or vibration, in some embodiments (see FIG. 6), at least some of the support bases (e.g. 101i) can be mounted at an angle (230), such as a 90 degree angle, or some other angle such as 45 degrees (in general angle 230 can be an angle greater than zero degrees—e.g. not parallel, and up 90 degrees—e.g. perpendicular) to other support bases (e.g. 101f, 101g, 101h). In this configuration, at least one energy collector from a first support base (here 101i) is non-parallel to at least one energy collector from a second support base (such as any of 101f, 101g, or 101h).

Note that in the configuration shown in FIG. 5, at least some of the plurality of support bases (101c, 101d, 101f) are configured in a parallel stacked arrangement. In this embodiment, at least one moveable generator gear (200) is configured to engage with energy collectors (such as 113f) disposed over a plurality of these different support bases. Thus, in this embodiment, the at least one moveable generator gear also comprises one central generator gear (200). However multiple generator gears, with a different arrangement of energy collectors and electronic actuators, could also be used.

In this particular embodiment, the at least one moveable generator gear is a central gear, and the various energy collectors are positioned concentrically around this central gear. However, this is but one of a number of alternative configurations.

As previously discussed, in some embodiments it is useful to configure the energy collectors so that the energy collectors can capture changes in ambient motion (e.g. acceleration and deceleration) and ambient vibration energy along many different directions. Specifically, the energy collectors can be configured to collect ambient motion energy along 3 dimensions of motion (actually directions of changes in acceleration). These dimensions can be horizontal (backward and forward) on a first "X" axis; horizontal (backward and forward) along a second "Y" axis perpendicular to a first axis; and vertical (up and down) along a third "Z" axis perpendicular to the first and second axis.

Exploring this concept in further detail, FIG. 6 shows another embodiment of the present invention, in which again each support base (101f, 101g, 101h, 101i) has a plurality of oscillating weight type energy collectors (113f). In FIG. 6, some support bases are positioned at an angle with respect to other support bases (here one support base 101i is shown positioned perpendicular—angled at 90 degrees to other support bases 101f, 101g, 101h), thus allowing the system to collect energy from multiple ambient motion/vibration angles (e.g. up and down vibration, as well as side to side vibration). In this embodiment, the system has two generator gears (200a, 200b), here coupled together by interlocking gears (220a, 220b).

Thus, in this arrangement the force of rotation (e.g. torque), released from the various energy collectors (113f) by the action of the various electronic actuators (202f), is transmitted, by the two generator gears (200a, 200b) and the interlocking gears (222a, 220b) to the same electrical generator (302). Note that in an alternative embodiment, generator gear (200b) could be connected directly to its own generator, rather than to the common generator (302). Indeed, in some embodiments, each energy collector (113f) could be connected to its own unique generator gear and its own unique electrical generator.

Note that various types of electrical generators may be used. Here assume that the electrical generator is of a type that converts rotatory motion from the generator gear (which can alternatively be termed a generator shaft) into electrical power. Often the generator shaft is connected to a generator rotor. The electrical generator may be an electromagnetic generator, such as a dynamo or alternator. Other types of electrical generator, such as Faraday disk generators, direct current generators, homopolar generators, AC generators, or any type of device that translates mechanical force or motion into electrical energy may be used.

Control Methods:

In some embodiments, the energy harvester system will further comprise at least one battery (304) configured to receive electrical energy from the electrical generator (302), and will also comprise a battery charge sensor (308). In this embodiment, the computer processor (300) and various actuator cams (202*f*) can be configured to use the battery charge sensor to detect the level of battery charge. The computer processor can be configured (often by appropriate software or firmware) so that when the battery charge is below a preset threshold, the computer processor (300) will direct one or more various electronic actuators (202*f*) to charge the battery. This can be done by having the processor command the appropriate electronic actuator to move at least one energy harvester (113*f*) from its first position to a second position, where the energy harvester can release its stored energy to the generator gear (200), and from there to the generator (302), thus producing energy to charge the battery (304). Note that due to the flexible nature of the present invention, only those actuators and energy collectors needed to adequately charge the battery need to be activated by the processor at any given time. If the battery has a low charge, the processor may alternatively sequentially and continually engage a plurality of the energy collectors until the battery charge is above a preset threshold.

Figure 7:
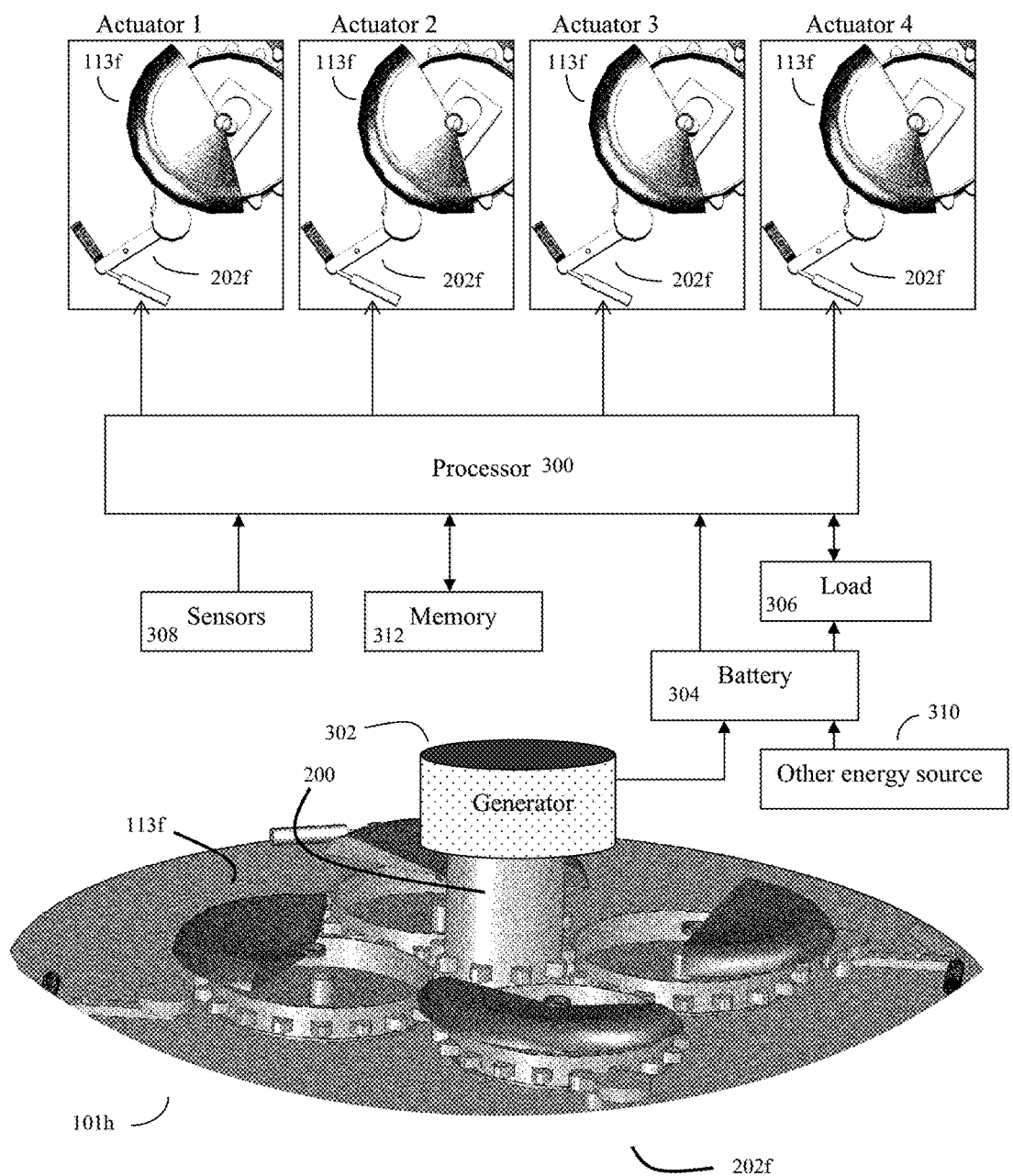
FIG. 7 shows an example of an energy harvester system and associated control circuitry.

FIG. 7 shows an example of a more elaborate energy harvester system and associated control circuitry. This more elaborate energy harvester system comprises at least one computer processor (300), an electrical generator (300), and a support base (101*h*). In this embodiment, four electronic actuators (here all labeled 202*f*, but in conjunction with their associated energy harvesters also identified as Actuator 1, Actuator 2, Actuator 3, and Actuator 4) are controlled by processor (300). In this embodiment, processor (300) is powered by rechargeable battery (304), and rechargeable battery (304) is in turn charged by electrical energy from generator (302). In some embodiments, battery (304) may also receive supplemental power from other energy sources (310), such as photovoltaic cells (e.g. solar cells) and the like.

Thus, in this embodiment, energy harvester system may further comprise an alternate energy source (310) configured to also charge the battery (304).

The energy harvester system will typically also be connected to an electrical load (306) which consumes electrical power. This electrical load can comprise one or more devices configured to perform a useful activity, such as emitting light, wirelessly transmitting and/or receiving data, capturing images and the like. In some embodiments, the processor itself is the load, and the processor may perform additional useful work beyond just running the energy harvester, such as monitoring sensors (308) and storing and retrieving sensor data into memory (312). The processor (300) will often further comprise a clock configured to measure at least elapsed time.

In some embodiments, the sensors (308) may comprise both motion sensors (e.g. accelerometers) and battery charge sensors. In these embodiments, processor (300) may use the motion sensors (308) and records from memory (312) of when the various actuators last commanded the energy collectors to discharge their stored vibrational energy into the generator gear (200), to estimate the amount of vibrational energy that has been stored in the various energy collectors (113*f*). The processor (300) can also monitor the charge status of the battery (304), and additionally also determine future energy needs of the load (306), and availability of additional power from other energy sources (310) as well. If the processor determines that the battery (304) is running low on charge, and at least some of the energy collectors (113*f*) have sufficient stored mechanical energy, then the processor may command suitable electronic actuators (202*f*) (e.g. actuator 1 and 2) to cause these energy collectors to discharge their energy into the generator gear (200) in a manner that operates the generator (302) with a higher efficiency. This might be, for example, a fast, sequential, operation where first actuator 1 activates, followed immediately by activating actuator 2. The processor, which may include a clock or elapsed time function, can then store a record of this action in memory (312). Memory (312) may be random access memory (RAM), flash memory, or the like.

More specifically, in some embodiments, the invention may further comprise at least one accelerometer sensor (308). In these embodiments, the processor (300) may be configured to use the accelerometer sensor(s) to compute an amount of stored ambient motion energy stored in at least one of the various energy collectors (113*f*). The processor may also be configured to use the computed amount of stored ambient motion energy to control the operation of at least one electronic actuator (113*f*).

However, if processor (300) determines that the battery (304) is adequately charged, then the processor (300) may elect to defer activating any of the actuators until such a time that the battery (304) needs further charging. This illustrates a significant advantage of the present invention over prior art, such as Lee, because the present invention can intelligently manage the energy collectors, and optimize the overall performance of the system.

Note that in FIG. 7, the various electronic actuators (202*f*) and energy collectors (113*f*) are in effect shown twice. They are shown in the top part of FIG. 7 in the context of the system's control circuitry, and then again in the bottom portion of FIG. 7 in the context of the system's mechanical elements, such as the support base (101*h*). This helps to explain how the electronic control elements and the mechanical elements all interact to produce the invention.

In some specific embodiments, the energy harvester system can comprise at least one computer processor (300), and at least one electrical generator (see FIG. 6 and FIG. 7 302). The system also comprises at least one generator gear (200), and at least one support base (101). According to the invention, at least one electronic actuator (e.g. 202*a*, 202*b*) is attached to this at least one support base (101). This at least one actuator (e.g. 202*a*, 202*e*) is configured to provide an actuator force response to control signals from the processor (300). Typically, each actuator (202*a*, 202*e*) further comprises, or is at least attached to, at least one actuator cam (e.g. 210*a*, 210*e*). This at least one actuator cam is operably engaged to, or connected with, its respective actuator so that each at least one cam (e.g. 210*a*, 210*e*) is configured to be moved by this actuator force. Thus, for each individual actuator, at least some of the actuator force, and actuator movement generates a resulting cam force, typically against an associated energy collector. Thus, in a typical situation where there are a plurality of energy collectors (113*a* . . . 113*f*), each associated actuator (e.g. 202*a*, 202e ... 202f), when activated by the processor (300), ends up moving its associated actuator towards at least one generator gear (200).

In some embodiments, each at least one energy collector (e.g. 113a ... 113f) is reversibly clamped to a support base (101), often by way of a track (e.g. track 126e), previously discussed, and discussed further shortly. The various energy collectors (e.g. 113a ... 113f) can be configured so that in response to receiving cam force, the energy collectors slidable unclamp from the support base (101), producing at least one unclamped energy collector, while other energy collectors remain clamped on the support base (101). This at least one unclamped energy collector is then configured to slide towards at least one generator gear (200).

In these specific embodiments, each of the at least one energy collectors may further comprise a clamping member (134) attached to and extending from an energy collector base of the energy collectors. This clamping member may be configured to clamp the energy collector to one of a plurality of pins (112a) extending from a surface of the support base (101a). This keeps the energy collector in the first state where the energy collector accumulates ambient motion energy. Here the clamping member (134) may be further configured to unclamp its associated energy collector from its associated pin when the actuator cam (210a ... 210e) contacts the clamping member (134). This moves the energy collector to a second state where the energy collector discharges the stored mechanical energy into the generator gear.

In these specific embodiments, the energy collector can also comprise a guide projection (such as Lee 132a) extending from a lower surface of the energy collector base. This guide projection can, for example, be a geometric shape conforming to the shape of the guide element's slot.

This guide projection can be configured to slide within a slot of a guide element or track, such as (126e) positioned on a surface (101a) of the support base (101). This can enable the actuator cam to both unclamp a given energy collector from a first position, and to slide this energy collector, along track or guide (126e) towards a second position where the energy collector can then transfer energy to the moveable generator gear (200).

OTHER EMBODIMENTS

In some embodiments, the generator shaft may be also be coupled to other types of wind or water collectors configured to also capture ambient energy from wind or raindrops. Here, the use of software configured clutches may be useful to control when the generator shaft is mechanically coupled and decoupled to such collectors. Indeed, in some embodiments, such as when the energy harvester device is configured proximate sources of heated air or even steam, the device may be further configured to harvest energy from the expansion or contraction of the heated air or steam.

In some embodiments, the energy harvester device may be mounted on a flexible or moveable support to help further transfer ambient motion to the various energy collectors. Indeed, the device may be mounted on springs, rotating fixtures, and even pendulums to help couple a broader range of ambient motion to the various energy collectors.

In some embodiments, the energy harvester device may employ more elaborate solar or light energy collectors, as well as thermal masses and thermocouple arrangements configured to harvest additional ambient energy from thermal sources. Such more elaborate light energy collectors can operate by covering some or all of the energy harvester device with solar cells, use of parabolic mirrors, and the like.

An additional advantage of using energy harvester systems configured with computer processor control mechanisms, and electrical energy storage batteries, is that these techniques create a lot of flexibility. In particular, these techniques allow the invention to be configured to also receive energy from other alternative energy sources as well.

In some embodiments, these other alternative energy sources can harvest energy from gasses or liquids that are moving past the energy harvester system. These gasses or liquids can include moving atmospheric gases (e.g. wind, hot air), liquids (water droplets, moving water), and the like. Here windmill designs, sail or air-foil type designs, waterwheel designs, turbine designs, and the like may be employed. In this context, the term "ambient motion" is also considered to encompass motion of ambient environmental materials (e.g. wind, gas, water droplets, water vapor, etc. with respect to the energy harvester system.

Figure 8:
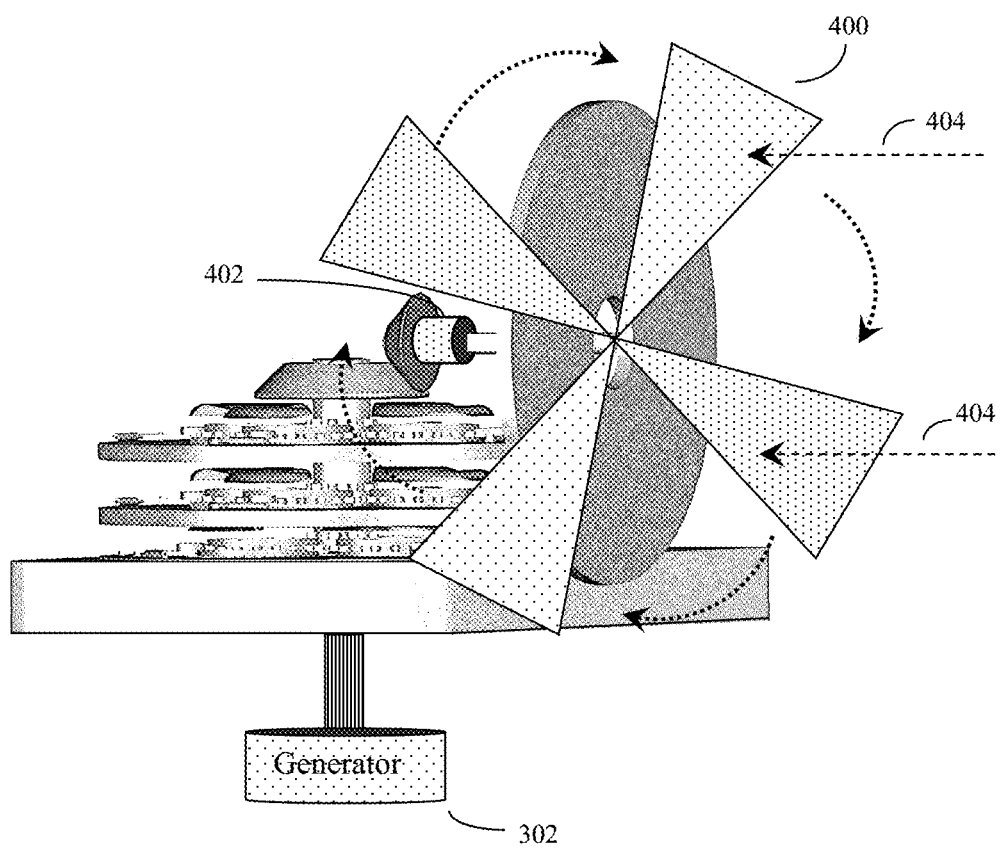
FIG. 8 shows an example of an energy harvester system configured with a supplemental mechanical mechanism (here a wind activated energy collection mechanism) to also receive alternative types of mechanical energy from additional outside sources.

FIG. 8 shows an energy harvester system configured with a supplemental mechanical mechanism (here a wind activated energy collection mechanism 400) to also receive alternative types of mechanical energy from additional outside sources.

Thus, in the configuration shown in FIG. 8, the at least one generator gear (200) can be connected, (often through a clutch 402 controlled by the computer processor 300), to at least one supplemental device comprising at least one supplemental mechanical mechanism (400) (here a windmill like design is shown) configured to harness an alternative type of mechanical energy from additional environmental sources.

This at least one supplemental mechanical mechanism (400) can comprise at least one of a wind activated energy collection mechanism, collecting energy from wind or other moving air source (404). Alternatively, the supplemental mechanical mechanism (400) can be configured to capture energy from falling water, such as falling raindrops or runoff water. In still other embodiments, the supplemental mechanical mechanism may be configured to capture energy from rising hot air (e.g. be configured on a roof exhaust vent), or even configured to capture steam energy. Thus, the supplemental mechanical mechanism could be a hot air activated energy collection mechanism, and/or a steam activated energy collection mechanism as well. In general, a broad range of rotating windmill, waterwheel, or turbine shapes can be used here.

Although the supplemental mechanical mechanism (400) can be configured to drive its own generator, and simply supply power to a common system storage battery (304), in some embodiments, it may be useful to couple the supplemental mechanical mechanism to the same generators (302) used by the various energy collectors (e.g. 113f).

If use of a common generator (302) is desired for both the energy collectors (e.g. 113f) and the supplemental mechanical mechanism (400), to reduce energy loss due to friction, in some embodiments, it may also be useful to employ both sensors to detect when energy is available from the supplemental mechanical mechanism (400). And a computer-processor controlled clutch (402). This "clutch" can be a processor controlled mechanical device that can engage and disengage the supplemental mechanical mechanism (400) from the generator gear or gears (200).

When the sensors detect that energy is not available from the supplemental mechanical mechanism (400), the computer processor (300) will often be configured to disengage the clutch (402) and the supplemental mechanism (400) from the generator gear or gears (200). This enables the stored energy from the various energy collectors (113f) to go only into the generator gear (200) and the generator (302). If the clutch (402) was not disengaged, the stored energy from the various energy collectors (113f) might be misdirected and wasted by turning the supplemental mechanism (400) instead.

When the sensors detect that energy is available from the supplemental mechanism (400), the computer processor (300) can be configured to engage the clutch (402), thus enabling energy from the supplemental mechanism to be directed to the generator gear (200) and into the generator (302). This produces electrical power that can be stored in the battery (304) for later use.

Making More Efficient Use of Ambient Environmental Motion

In use, the energy harvester system will often be mounted in regions where ambient mechanical vibration is expected. These regions can include vehicle environments, where the vehicle may encounter sudden changes in acceleration, outdoor environments, where the system may encounter gusts of wind, and the like. The system's energy collectors are well suited towards harvesting sustained mechanical energy in a certain range of frequencies that tend to couple well with the natural frequency of the energy collector's pendulums (120), but may not operate so efficiently in response to large transient mechanical shocks, such as might be produced by a sudden gust of wind, or a sudden impact. To improve efficiency, additional mechanical methods, such as the various oscillating structures described below, may be useful.

Figure 9:
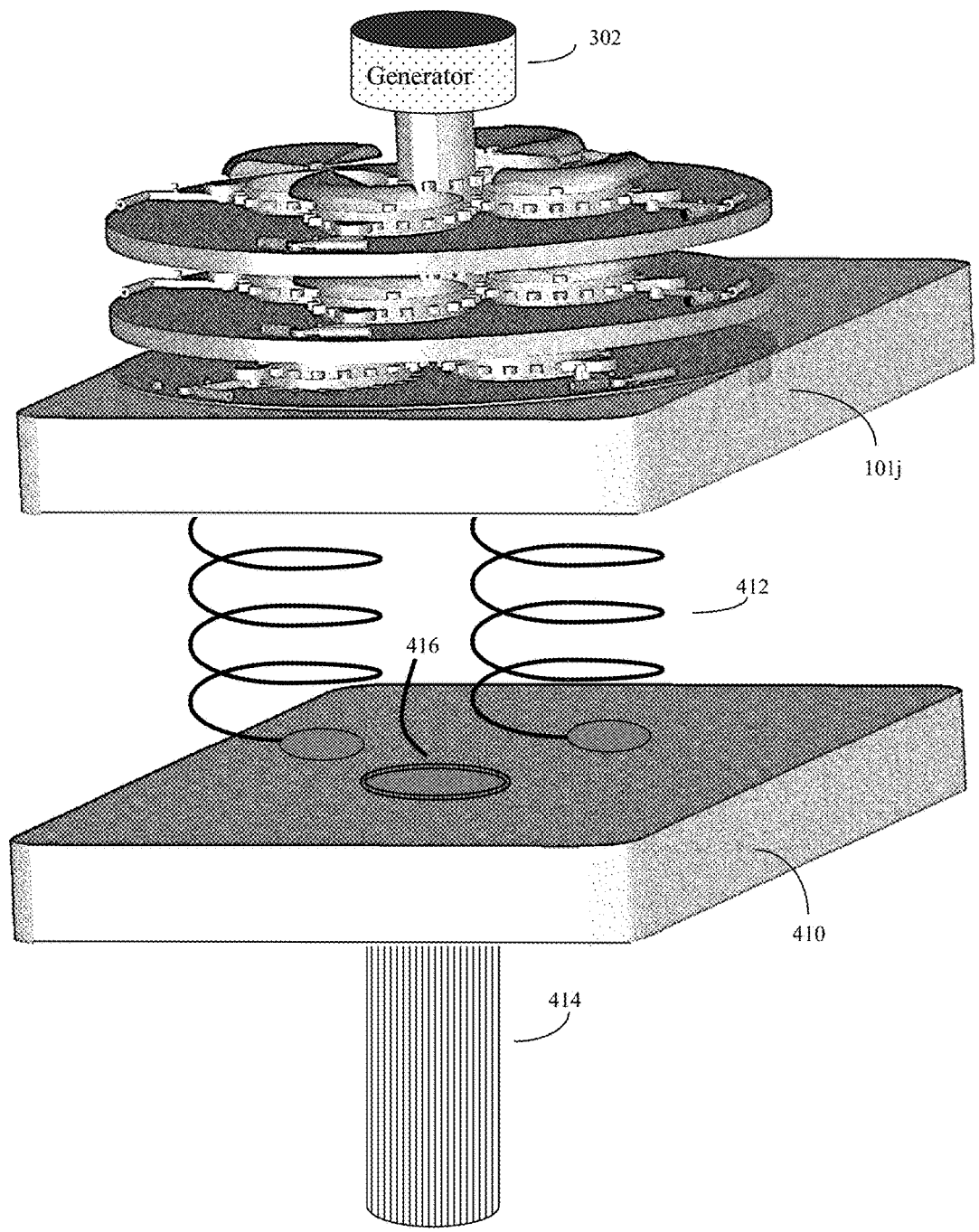
FIG. 9 shows an example of an energy harvester system configured with a support base that is mounted on an oscillating structure. This allows a broader range of different outside motion to ultimately be coupled to the various energy collector devices.

FIG. 9 shows an example of an energy harvester system configured with a support base (101j) that is mounted on an oscillating structure (410). This allows a broader range of different outside motion to ultimately be coupled to the various energy collector devices.

In this embodiment, at least one support base of the energy harvester system is further mounted on an oscillating structure configured with at least one oscillating mechanism, such as one or more springs (412), preferably underdamped springs that will continue oscillating for long periods of time after receiving a sudden jolt of outside mechanical force.

Here, the springs do not function as shock absorbers. Instead the underdamped springs can take a transient mechanical shock, that might only activate the various energy collectors for a short period of time, and (essentially by jiggling over the much longer period of time that it takes an underdamped spring or other oscillator to stop vibrating) more efficiently transfer the energy from the transient mechanical shock to the various energy collectors. That is, while a brief shock might jiggle the various pendulum members (120) on the energy collectors for few tenths of a second, the underdamped oscillating structure (410) may continue to jiggle back and forth for many seconds, thus enabling much more of the energy from the brief mechanical shock to be transferred to the energy collectors. Thus, in essence, this oscillating structure (410) can be configured to couple a broader range of ambient motion energy, or a greater amount of ambient motion energy, to the various energy collectors.

In some embodiments, various types of oscillating mechanisms, and sometimes more than one oscillating mechanism, may be used. For example, the at least one oscillating mechanism can comprise any of at least one spring (such as the springs 412), one or more flexible poles (such as pole 414), pendulums, or rotation joints (416). These can be configured to cause the at least one support base (101j) to experience a broader range of motions and/or a longer duration of motion, in response to ambient motion (e.g. wind, sudden mechanical shocks) and ambient motion stimuli, then would be possible if the various oscillating mechanisms were not present.

Figure 10:
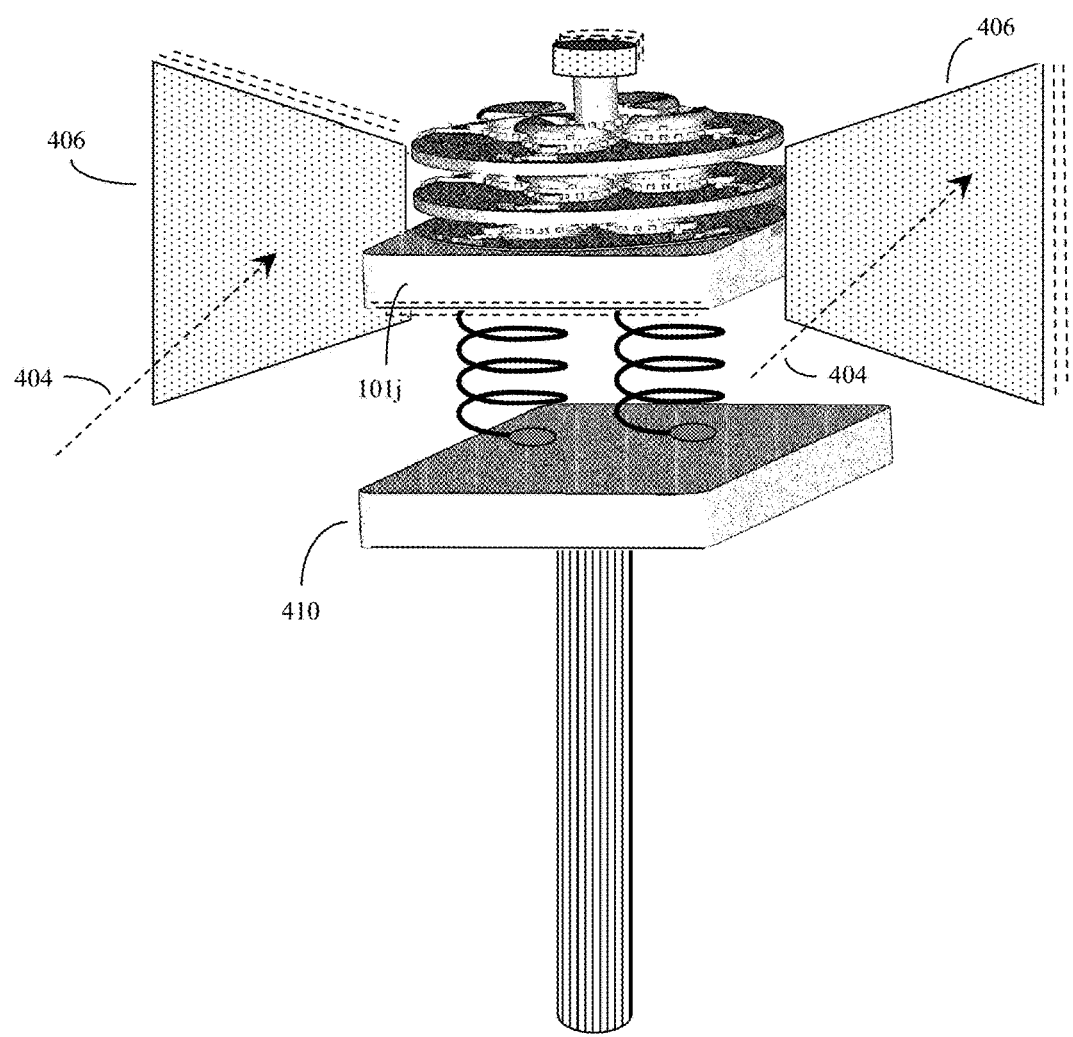
FIG. 10 shows the energy harvester system previously shown in FIG. 9, here configured with multiple wind blades or wind vanes. Wind, blowing on the wind blades, thus causes the support structure to vibrate relative to the oscillating structure, thus collecting ambient wind energy that can in turn be stored by the various energy collector devices.

FIG. 10 shows the energy harvester system previously shown in FIG. 9, here configured with multiple wind blades or wind vanes (406). Wind (404), blowing on the wind blades (406), thus causes the support structure (101j) to vibrate relative to the oscillating structure, thus collecting ambient wind energy that can in turn be stored by the various energy collector devices.

Improved Photovoltaic Systems

As previously discussed, the energy harvester system can also be configured to use photovoltaic cells to harness ambient light energy. Here, some of these various photovoltaic cell configurations are discussed in more detail.

Figure 11:
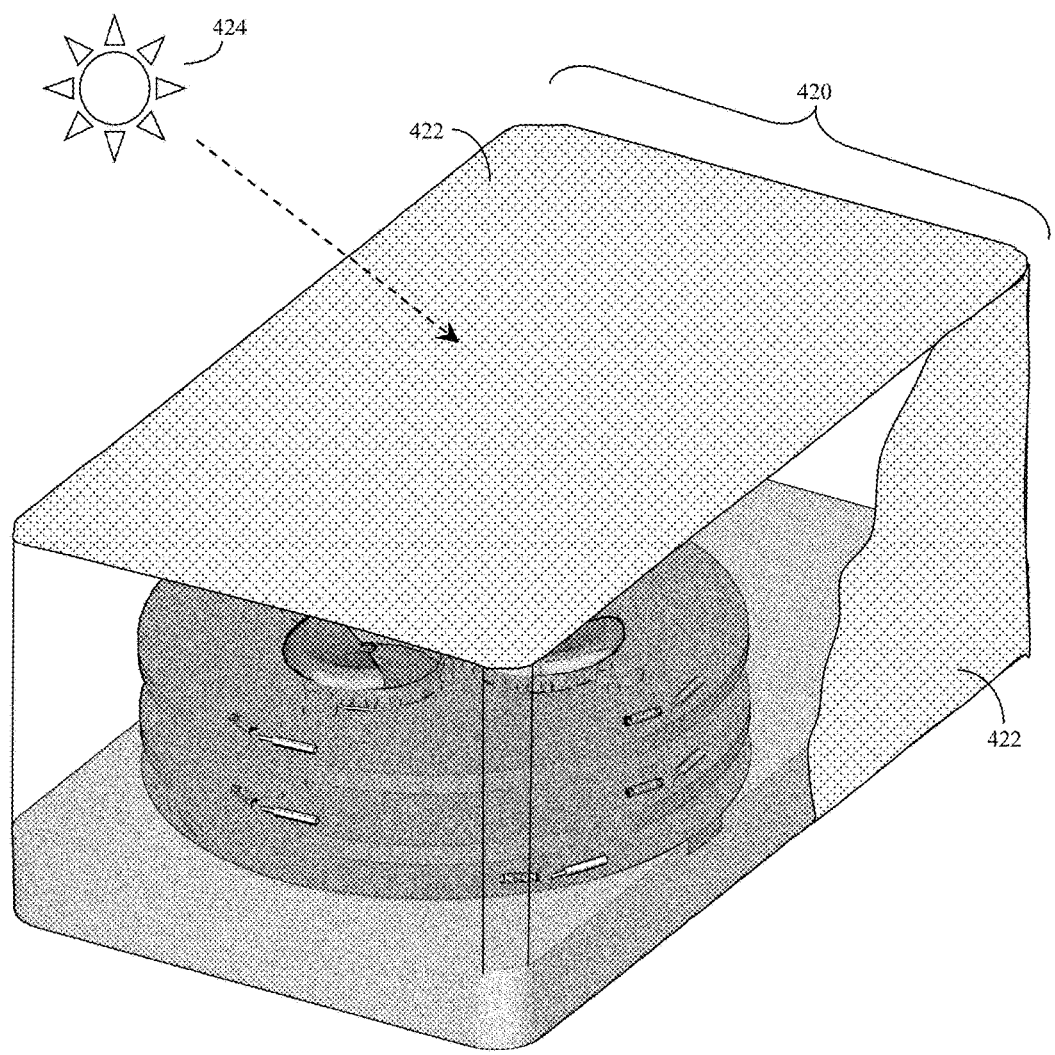
FIG. 11 shows an example of an energy harvester system that is encased in an enclosure. Here a substantial portion of the outside of this enclosure is covered by one or more photovoltaic cells.

FIG. 11 shows an example of an energy harvester system that is encased in an enclosure (420). Here a substantial portion of the outside of this enclosure is covered by one or more photovoltaic cells (422). Here a solar source of light energy is also shown (424)

In this embodiment, the energy harvester system, including the at least one energy collector (113f), the at least one moveable generator gear (200), and the at least one electrical generator (302) is encased in an enclosure (420), and at least 50% of an exterior surface of this enclosure is covered by at least one photovoltaic cell (422).

Making More Efficient Use of Both Visible Light and Infrared Light

Sunlight from the sun (424) can be considered to consist of both visible light (426) and infrared light (428). Solar cells typically only capture the visible light portion of the spectrum, and indeed are notorious for becoming quite hot when exposed to sunlight. This heat buildup decreases the efficiency of many photovoltaic cells, and also represents wasted energy that might otherwise be captured by the energy harvester system.

Figure 12:
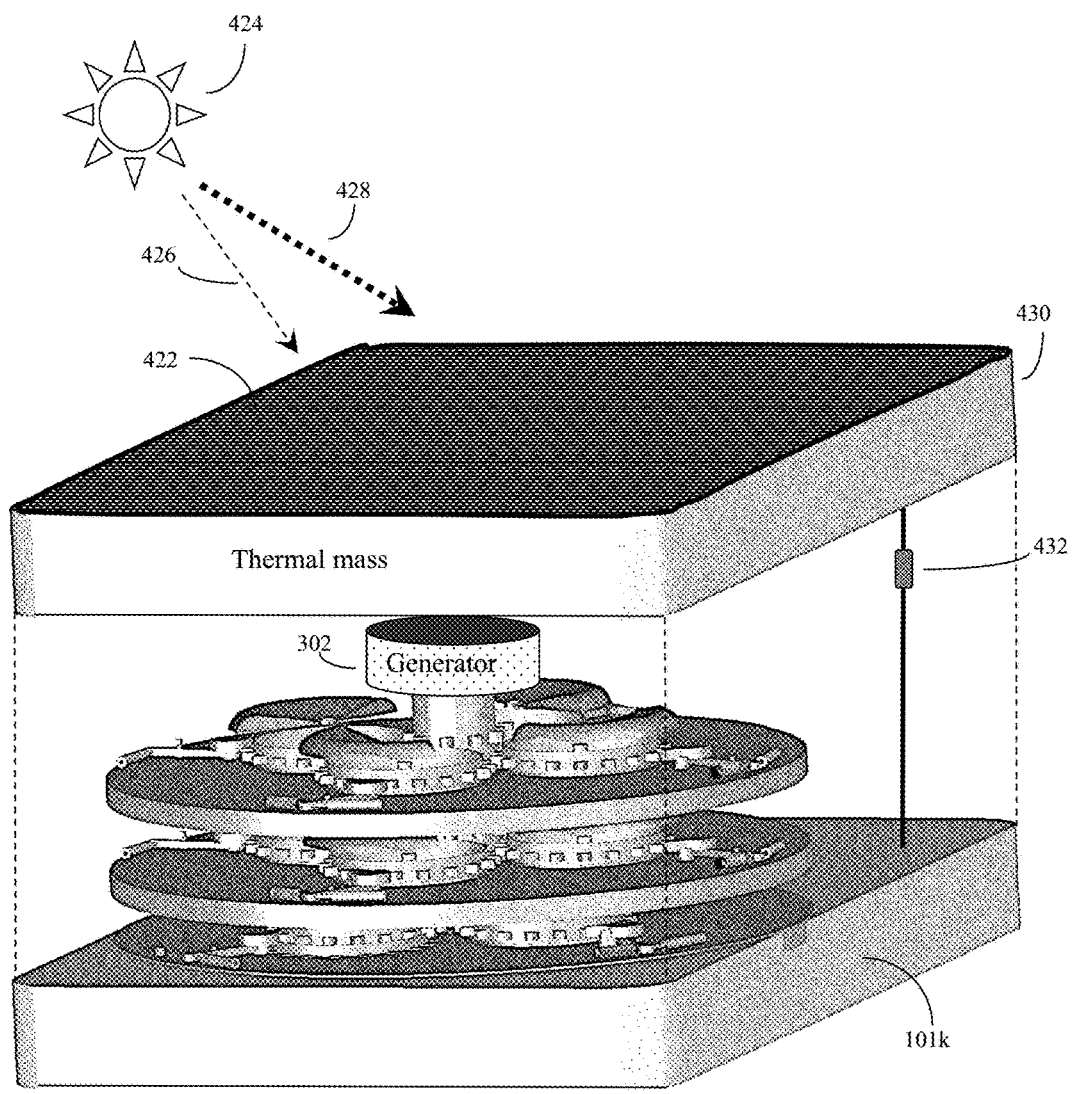
FIG. 12 shows an example of an energy harvester system that, in addition to having at least one photovoltaic cell, also comprises a thermal mass configured to store thermal energy, such as solar heat from the sun. Additional thermal energy can be harvested from this thermal mass, often in the form of electrical energy, such as by way of a thermocouple device or other mechanism.

FIG. 12 shows an example of an energy harvester system that, in addition to having at least one photovoltaic cell (422) to capture energy from the visible light component (426), also comprises a thermal mass (430) configured to store thermal energy from the infrared component (428) (e.g. solar heat from the sun). This thermal mass (430) can be positioned in contact with and/or underneath, the photovoltaic cell(s) 422. The thermal mass can be any material that can store heat well, such as metal, ceramic, glass, salts, eutectic salt mixtures, and the like. The thermal mass thus helps keep the temperature of the photovoltaic cells from getting too high, and also helps capture the otherwise unused infrared energy and uses it to generate electrical power by an alternative mechanism, discussed below.

Thus, while the sun is shining, the energy harvester system, in addition to harvesting ambient mechanical energy, can also use the photovoltaic cells (422) to harvest light energy (426). Assume here, that while the sun is shining, the thermal mass (430) is also heating up, but other parts of the system, such as the ambient environment, or a support base, with its own thermal mass (101k), being shaded by the thermal mass, or at least not directly exposed to the sun, will usually be at a lower temperature than the thermal mass (430).

Here the system can be configured to harvest the thermal energy stored in the thermal mass (430) in the form of an electrical current. Here, for example, a thermocouple device (432) or other mechanism can be configured to straddle or connect to both the thermal mass (430) and a lower ambient temperature thermal mass such as support (101k), and utilize the temperature differences to produce electrical current that can also be stored in the battery (304).

Thus, in this embodiment, the energy harvester system can further comprise a thermal mass (430) and thermocouple system (432) configured underneath at least one photovoltaic cell (422). Put alternatively, this thermal mass is typically configured to retain solar heat (428) when the photovoltaic cell(s) receive solar illumination (426, 428) from the sun (424). The thermocouple system (432) will typically be configured to obtain electrical energy from thermal differences between a temperature of the thermal mass (430), and a temperature of an ambient environment, such as (101k). This electrical energy can also be stored in a battery (304) as desired.

Figure 13:
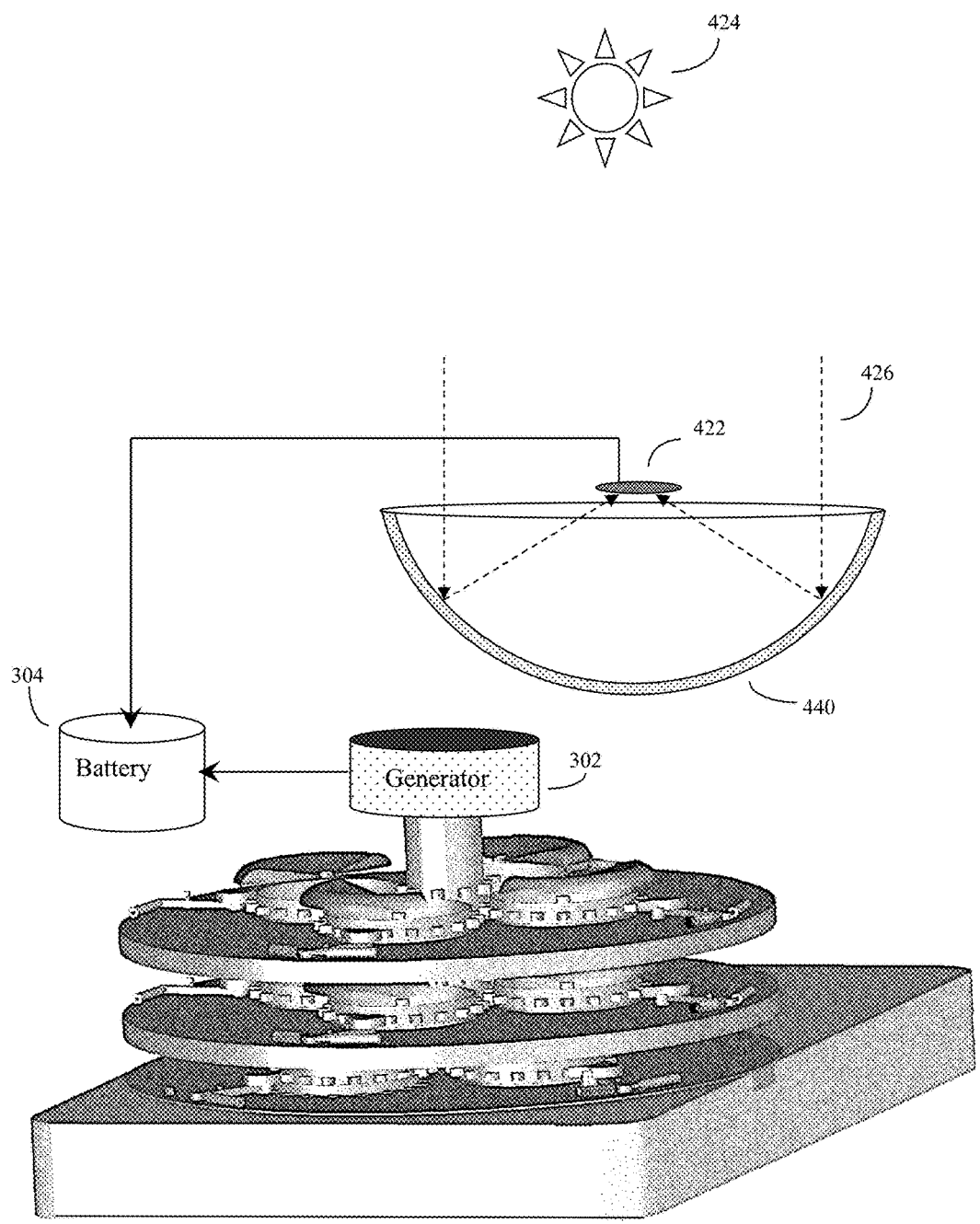
FIG. 13 shows an example of an energy harvester system that uses at least one curved mirror, and at least one photovoltaic cell configured at a focal region of the curved mirror, to also capture light energy as well.

In some embodiments, it may be useful to supplement the ability of the photovoltaic cell to collect light energy by utilizing various light concentration devices, such as lenses, and in particular curved mirrors. FIG. 13 shows an example of an energy harvester system that uses at least one curved mirror (440), and at least one photovoltaic cell (422) configured at a focal region of the curved mirror, to also capture low levels of light energy as well. Indeed, if the curved mirror is sufficiently large enough, even non-traditional sources of light energy power, such as moonlight and the like, can also be harnessed to help provide electrical energy for the system.

The invention claimed is:

1. An energy harvester system comprising:
a computer processor;
at least one electrical generator comprising at least one moveable generator gear;
at least one support base;
at least one energy collector movably connected to said support base, each at least one energy collector configured to, in a first position, store ambient motion energy along at least one direction of ambient motion as stored mechanical energy, and in a second position to release said stored mechanical energy to at least one moveable generator gear;
wherein said each of said at least one energy collector further comprises:
an energy collector base attached to a surface of said support base;
a central axial member attached to said energy collector base;
a pendulum member rotatably connected to said central axial member, said pendulum member actuated by ambient motion and rotated in one of a clockwise direction and a counterclockwise direction;
a geared case encircling said central axial member, rigidly attached to said pendulum member, and running along a base groove configured in said energy collector base, said geared case comprising a plurality of gear tooth elements positioned on an outer surface of said geared case, said geared case configured to rotate along said base groove; and
a spring element winding around said central axial member within said geared case, said spring element comprising a first end fixedly attached to said central axial member and a second end fixedly attached to an inner surface of said geared case, wherein said spring element is compressed by rotation of said pendulum member and stores said ambient motion energy as a compressed spring element, and wherein said compressed spring element is configured to release said stored ambient motion energy to rotate said geared case;
at least one electronic actuator and associated actuator cam attached to said support base, said at least one electronic actuator configured to provide actuator force response to control signals from said computer processor, thus moving said actuator cam and providing cam force;
wherein said at least one energy collector is configured so that upon receiving said cam force, said at least one energy collector moves from said first position to a second position that is coupled to said at least one moveable generator gear, thus releasing stored mechanical energy to said at least one moveable generator gear, and rotating said at least one moveable generator gear;
wherein said at least one electrical generator is configured to convert rotation of said at least one moveable generator gear into electrical energy;
wherein each said at least one electronic actuator comprises a moving actuator component configured, upon response to control signals from said computer processor, to at least incrementally move said actuator cam towards a position that generates said cam force;
further comprising a battery configured to receive electrical energy from said electrical generator, and a battery charge sensor;
further comprising at least one accelerometer sensor, wherein said computer processor is configured to use said accelerometer sensor to compute an amount of stored ambient motion energy stored in at least one of said energy collectors, and to use said amount of stored ambient motion energy to control an operation of said at least one electronic actuator;
wherein said computer processor and said actuator cam is configured so that when a battery charge of said battery is below a preset threshold, said computer processor is configured to operate said electronic actuator to sequentially and continually engage a plurality of said at least one energy collector until said battery charge is above said preset threshold;
wherein each said at least one electronic actuator further comprises an electronically controlled actuator element configured to expand or contract in response to electrical current signals from said computer processor; and
wherein said electronically controlled actuator element is an electroactive polymer element.

2. The energy harvester system of claim 1, wherein said support base comprises a plurality of support bases comprising at least first and second support bases; and
each of said plurality of support bases further comprises at least one of said at least one energy collector and at least a portion of said at least one moveable generator gear, and wherein:
a) at least some of said support bases are mounted so that said at least one energy collector from a first support base are parallel to said at least one energy collector from a second support base; and/or
b) at least some support bases are mounted at an angle greater than zero degrees and up to 90 degrees to other support bases so that said at least one energy collector from a first support base are non-parallel to said at least one energy collector from a second support base.

3. The energy harvester system of claim 2, wherein at least some of said plurality of support bases are configured in a parallel stacked arrangement; and said at least one moveable generator gear is configured to engage with energy collectors disposed over a plurality of said support bases.

4. The energy harvester system of claim 3, wherein said at least one moveable generator gear comprises one central generator gear.

5. The energy harvester system of claim 1, wherein said energy harvester system further comprises at least one alternate energy source configured to also charge said battery.

6. The energy harvester system of claim 5, wherein said at least one alternate energy source comprises at least one photovoltaic cell.

7. The energy harvester system of claim 6, wherein said at least one photovoltaic cell is configured in a focal region of at least one curved mirror.

8. The energy harvester system of claim 6, wherein said at least one energy collector, said at least one moveable generator gear, and said at least one electrical generator is encased in an enclosure, and at least 50% of an exterior surface of said enclosure is covered by said at least one photovoltaic cell.

9. The energy harvester system of claim 6, further comprising a thermal mass and thermocouple system configured underneath said at least one photovoltaic cell, said thermal mass configured to retain solar heat when said at least one photovoltaic cell receives solar illumination;

said thermocouple system further configured to obtain electrical energy from thermal differences between a temperature of the thermal mass, and a temperature of an ambient environment.

10. The energy harvester system of claim 5, herein said at least one generator gear is connected, through a clutch controlled by said computer processor, to at least one supplemental device comprising at least one supplemental mechanical mechanism configured to harness an alternative type of mechanical energy from additional environmental sources;

said at least one supplemental mechanical mechanism comprising a wind activated energy collection mechanism.

11. The energy harvester system of claim 1, wherein said at least one support base is further mounted on an oscillating structure configured with at least one oscillating mechanism, said oscillating structure configured to couple a broader range of ambient motion to at least one said energy collector;

wherein said at least one oscillating mechanism comprises any of at least one spring, flexible pole, pendulum, rotation joint or wind blade configured to cause said at least one support base to experience a broader range of motions in response to any of said ambient motion.

12. An energy harvester system comprising:
a computer processor;
at least one electrical generator comprising at least one moveable generator gear;
at least one support base;
at least one energy collector movably connected to said support base, each at least one energy collector configured to, in a first position, store ambient motion energy along at least one direction of ambient motion as stored mechanical energy, and in a second position to release said stored mechanical energy to at least one moveable generator gear;
wherein said each of said at least one energy collector further comprises:
an energy collector base attached to a surface of said support base;
a central axial member attached to said energy collector base;
a pendulum member rotatably connected to said central axial member, said pendulum member actuated by ambient motion and rotated in one of a clockwise direction and a counterclockwise direction;
a geared case encircling said central axial member, rigidly attached to said pendulum member, and running along a base groove configured in said energy collector base, said geared case comprising a plurality of gear tooth elements positioned on an outer surface of said geared case, said geared case configured to rotate along said base groove; and
a spring element winding around said central axial member within said geared case, said spring element comprising a first end fixedly attached to said central axial member and a second end fixedly attached to an inner surface of said geared case, wherein said spring element is compressed by rotation of said pendulum member and stores said ambient motion energy as a compressed spring element, and wherein said compressed spring element is configured to release said stored ambient motion energy to rotate said geared case;
at least one electronic actuator and associated actuator cam attached to said support base, said at least one electronic actuator configured to provide actuator force response to control signals from said computer processor, thus moving said actuator cam and providing cam force;
wherein said at least one energy collector is configured so that upon receiving said cam force, said at least one energy collector moves from said first position to a second position that is coupled to said at least one moveable generator gear, thus releasing stored mechanical energy to said at least one moveable generator gear, and rotating said at least one moveable generator gear;
wherein said at least one electrical generator is configured to convert rotation of said at least one moveable generator gear into electrical energy;
wherein each said at least one electronic actuator comprises a moving actuator component configured, upon response to control signals from said computer processor, to at least incrementally move said actuator cam towards a position that generates said cam force;
further comprising a battery configured to receive electrical energy from said electrical generator, and a battery charge sensor;
further comprising at least one accelerometer sensor, wherein said computer processor is configured to use said accelerometer sensor to compute an amount of stored ambient motion energy stored in at least one of said energy collectors, and to use said amount of stored ambient motion energy to control an operation of said at least one electronic actuator wherein said computer processor and said actuator cam is configured so that when a battery charge of said battery is below a preset threshold, said computer processor is configured to operate said electronic actuator to sequentially and continually engage a plurality of said at least one energy collector until said battery charge is above said preset threshold;
wherein said energy harvester system further comprises at least one alternate energy source configured to also charge said battery; and wherein said at least one alternate energy source comprises at least one photovoltaic cell;

further comprising a thermal mass and thermocouple system configured underneath said at least one photovoltaic cell, said thermal mass configured to retain solar heat when said at least one photovoltaic cell receives solar illumination;

said thermocouple system further configured to obtain electrical energy from thermal differences between a temperature of the thermal mass, and a temperature of an ambient environment.

13. The energy harvester system of claim 12, wherein said at least one photovoltaic cell is configured in a focal region of at least one curved mirror.

14. The energy harvester system of claim 12, wherein said at least one energy collector, said at least one moveable generator gear, and said at least one electrical generator is encased in an enclosure, and at least 50% of an exterior surface of said enclosure is covered by said at least one photovoltaic cell.

15. The energy harvester system of claim 12, herein said at least one generator gear is connected, through a clutch controlled by said computer processor, to at least one supplemental device comprising at least one supplemental mechanical mechanism configured to harness an alternative type of mechanical energy from additional environmental sources;

said at least one supplemental mechanical mechanism comprising at least one of a wind activated energy collection mechanism.

16. The energy harvester system of claim 12, wherein said at least one support base is further mounted on an oscillating structure configured with at least one oscillating mechanism, said oscillating structure configured to couple a broader range of ambient motion to at least one said energy collector;

wherein said at least one oscillating mechanism comprises any of at least one spring, flexible pole, pendulum, rotation joint, or wind vein configured to cause said at least one support base to experience a broader range of motions in response to said ambient motion.

17. An energy harvester system comprising:

a computer processor;

at least one electrical generator comprising at least one moveable generator gear;

at least one support base;

at least one energy collector movably connected to said support base, each at least one energy collector configured to, in a first position, store ambient motion energy along at least one direction of ambient motion as stored mechanical energy, and in a second position to release said stored mechanical energy to at least one moveable generator gear;

wherein said each of said at least one energy collector further comprises:

an energy collector base attached to a surface of said support base;

a central axial member attached to said energy collector base;

a pendulum member rotatably connected to said central axial member, said pendulum member actuated by ambient motion and rotated in one of a clockwise direction and a counterclockwise direction;

a geared case encircling said central axial member, rigidly attached to said pendulum member, and running along a base groove configured in said energy collector base, said geared case comprising a plurality of gear tooth elements positioned on an outer surface of said geared case, said geared case configured to rotate along said base groove; and a spring element winding around said central axial member within said geared case, said spring element comprising a first end fixedly attached to said central axial member and a second end fixedly attached to an inner surface of said geared case, wherein said spring element is compressed by rotation of said pendulum member and stores said ambient motion energy as a compressed spring element, and wherein said compressed spring element is configured to release said stored ambient motion energy to rotate said geared case;

at least one electronic actuator and associated actuator cam attached to said support base, said at least one electronic actuator configured to provide actuator force response to control signals from said computer processor, thus moving said actuator cam and providing cam force;

wherein said at least one energy collector is configured so that upon receiving said cam force, said at least one energy collector moves from said first position to a second position that is coupled to said at least one moveable generator gear, thus releasing stored mechanical energy to said at least one moveable generator gear, and rotating said at least one moveable generator gear;

wherein said at least one electrical generator is configured to convert rotation of said at least one moveable generator gear into electrical energy;

wherein each said at least one electronic actuator comprises a moving actuator component configured, upon response to control signals from said computer processor, to at least incrementally move said actuator cam towards a position that generates said cam force;

further comprising a battery configured to receive electrical energy from said electrical generator, and a battery charge sensor;

further comprising at least one accelerometer sensor, wherein said computer processor is configured to use said accelerometer sensor to compute an amount of stored ambient motion energy stored in at least one of said energy collectors, and to use said amount of stored ambient motion energy to control an operation of said at least one electronic actuator wherein said computer processor and said actuator cam is configured so that when a battery charge of said battery is below a preset threshold, said computer processor is configured to operate said electronic actuator to sequentially and continually engage a plurality of said at least one energy collector until said battery charge is above said preset threshold;

wherein said energy harvester system further comprises at least one alternate energy source configured to also charge said battery;

wherein said at least one alternate energy source comprises at least one photovoltaic cell;

and wherein said at least one photovoltaic cell is configured in a focal region of at least one curved mirror.

* * * * *